United States Patent [19]
Murakami et al.

[11] Patent Number: 5,563,852
[45] Date of Patent: Oct. 8, 1996

[54] MAGNETO-OPTICAL RECORDING MEDIUM HAVING A READOUT LAYER WITH VARYING COMPOSITION AND CURIE TEMPERATURE

[75] Inventors: Yoshiteru Murakami, Nishinomiya; Naoyasu Iketani, Tenri; Akira Takahashi, Nara; Kenji Ohta, Kitakatsuragi, all of Japan

[73] Assignee: Sharp Kabushiki Kaisha, Osaka, Japan

[21] Appl. No.: 350,317

[22] Filed: Dec. 5, 1994

[30] Foreign Application Priority Data

Dec. 6, 1993 [JP] Japan .................. 5-305136

[51] Int. Cl.$^6$ ........................... G11B 5/66
[52] U.S. Cl. ............ 369/13; 369/14; 369/275.2; 360/59; 365/122; 428/694 MT; 428/694 RE; 428/694 EC; 428/694 GR
[58] Field of Search .................. 369/13, 14, 275.2; 360/59, 114; 365/122; 428/694 ML, 694 SC, 694 MT, 694 RE, 694 EC, 694 GR

[56] References Cited

U.S. PATENT DOCUMENTS

| | | | |
|---|---|---|---|
| 4,799,114 | 1/1989 | Tsunashima | 360/59 |
| 5,248,565 | 9/1993 | Tsutsumi et al. | 428/694 |
| 5,486,395 | 1/1996 | Murakami et al. | 428/64.3 |

FOREIGN PATENT DOCUMENTS

| | | |
|---|---|---|
| 0051296A1 | 5/1982 | European Pat. Off. . |
| 0545722A1 | 6/1993 | European Pat. Off. . |
| 58-073030 | 5/1983 | Japan . |
| 60-243840 | 12/1985 | Japan . |
| 61-276148 | 12/1986 | Japan . |
| 2-35371 | 8/1990 | Japan . |
| 5-81717 | 4/1993 | Japan . |

*Primary Examiner*—David C. Nelms
*Assistant Examiner*—Andrew Q. Tran
*Attorney, Agent, or Firm*—David G. Conlin; Brian L. Michaelis

[57] ABSTRACT

A magneto-optical recording medium includes a readout layer has in-plane magnetization at room temperature and in which a transition occurs from in-plane magnetization to perpendicular magnetization when temperature thereof is raised, and a recording layer for recording thereon information. The composition of the readout layer varies in a direction perpendicular to the surface thereof, and in the readout layer, the Co density on the light incident side is higher than the Co density on the interface between the readout layer and the recording layer. Therefore, the Curie temperature on the reproducing light incident side of the readout layer is high and the the polar Kerr rotation angle in reproducing increases, thereby achieving improvements in a reproducing signal quality. On the other hand, since the Curie temperature on the interface is low, the shift of the threshold temperature at which a transition occurs from in-plane to perpendicular by the magnetic interaction between the layers can be suppressed, thereby achieving a high quality reproducing signal without changing the laser power required for reproduction very much.

16 Claims, 20 Drawing Sheets

THRESHOLD TEMPERATURE : TEMPEATURE AT WHICH
A TRANSITION OCCURS
FROM IN-PLANE TO
PERPENDICULAR

MAGNETO-OPTICAL RECORDING MEDIUM HAVING A READOUT LAYER WITH VARYING COMPOSITION AND CURIE TEMPERATURE

FIELD OF THE INVENTION

The present invention relates to a magneto-optical recording medium such as a magneto-optical disk, a magneto-optical tape, a magneto-optical card, etc., for use in a magneto-optical recording device, and also relates to a manufacturing method thereof.

BACKGROUND OF THE INVENTION

Research and development on magneto-optical disks have been intensified as being rewritable optical disks, and some of the magneto-optical disks have been already practically used as external memory designed for computers.

In the magneto-optical disk, a magnetic thin film with perpendicular magnetization is used as a recording medium, and light is used in recording and reproducing. Thus, compared with a floppy disk or a hard disk wherein a magnetic thin film with in-plane magnetization is used, the magneto-optical disk has a larger recording capacity.

Recently, a magneto-optical recording medium which includes a recording layer composed of a magnetic layer having a multi-layer structure, which enables a reproduction of a recording bit with a size significantly smaller than the size of the light spot, i.e., a magneto-optical recording medium which enables a reproduction of high resolution has been proposed.

For example, Japanese Examined Patent Publication No. 81717/1993 (Tokukohei 5-81717) discloses a magneto-optical recording medium which includes a recording layer for recording information magneto-optically and a readout layer has in-plane magnetization at room temperature, and in which a transition occurs from in-plane magnetization to perpendicular magnetization when the temperature thereof is raised.

The magneto-optical recording medium enables reproduction of high resolution for the reasons explained with reference to FIG. 22 through FIG. 24.

As shown in FIG. 22, the magneto-optical disk is mainly composed of a substrate 101 whereon a transparent dielectric layer 102, a readout layer 103, a recording layer 104, a protective layer 105 and an overcoat layer 106 are laminated in this order.

As shown in the magnetic phase diagram of FIG. 23, a composition range where the rear-earth transition metal alloy used in the readout layer 103 has a perpendicular magnetization (shown by A in the figure) is extremely narrow. This is because perpendicular magnetization appears only in the vicinity of a compensating composition (shown by P in the figure) where the magnetic moment of the rare-earth metal and the magnetic moment of the transition metal balance with one another.

The respective magnetic moments of the rear-earth metal and the transition metal have mutually different temperature dependencies. Specifically, the magnetic moment of the transition metal is greater than that of the rear-earth metal at high temperature. Thus, the composition of alloy is set such that the content of the rear-earth metal is greater than that in the compensating composition at room temperature so that the alloy does not have perpendicular magnetization at room temperature but has in-plane magnetization. When a light beam is projected, as the temperature of the portion irradiated with the light beam is raised, the magnetic moment of the transition metal becomes relatively greater until it balances with that of the rear-earth metal, thereby having perpendicular magnetization.

FIG. 24($a$) through FIG. 24($d$) show one example of the hysteresis characteristics of the readout layer 103. In each figure, x-axis indicates an external magnetic field (Hex) to be applied perpendicularly onto the surface of the readout layer 103, and y-axis indicates polar Kerr rotation angle ($\theta K$) when a light beam is incident perpendicularly on the surface of the readout layer 103.

FIG. 24($a$) shows hysteresis characteristic of the readout layer 103 in a temperature range of room temperature—$T_1$, the transfer layer 103 having the composition shown by P in the magnetic phase diagram of FIG. 23. FIG. 24($b$) through FIG. 24($d$) respectively show hysteresis characteristics in temperature ranges of $T_1$–$T_2$; $T_2$–$T_3$; and $T_3$–Curie temperature $T_c$.

In the temperature range of $T_1$–$T_3$, the readout layer 103 shows such a hysteresis characteristic that an abruptly rising of Kerr rotation angle appears with respect to the external magnetic field. In other temperature ranges, however, the polar Kerr rotation angle without the application of the external magnetic field is substantially zero.

When the rear-earth transition metal having the described characteristics is applied to the readout layer, a higher density of the magneto-optical disk can be achieved. Namely, the reproduction of the recording bit with a size smaller than the size of the light spot is enabled for the reasons presented below.

As shown in FIG. 22, when reproducing, a reproduction-use light beam 107 is projected onto the readout layer 103 from the side of the substrate 101 so as to form a light spot 109. Here, on the recording layer 104, information is recorded in the magnetization direction shown in the figure. In the light spot 109 formed on the readout layer 103, the central portion is heated to the higher temperature than the peripheral portion. More specifically, since the reproduction-use light beam 107 is converged to a diffraction limit by the objective lens 105, the light intensity distribution shows a Gaussian distribution, and thus the temperature distribution of the portion subject to reproduction of the magneto-optical disk also like a Gaussian distribution. In the case where the reproduction-use light beam 107 is set such that the temperature of the central portion of the irradiated area in the readout layer 103 is raised above $T_1$ in FIG. 23 and the temperature of the peripheral portion is not raised above $T_1$, only the portion having a temperature rise above $T_1$ is subject to reproduction. Thus, the reproduction of a recording bit with a size smaller than the diameter of the light spot 109 is permitted, thereby achieving a significant improvement in the recording density.

When a transition occurs in the portion having a temperature above $T_1$ from in-plane magnetization to perpendicular magnetization (from the state shown in FIG. 24($a$) to the state shown in FIG. 24($b$) or the state shown in FIG. 24($c$)), by the exchange coupling force exerted between the readout layer 103 and the recording layer 104, the magnetization in the recording layer 104 is copied to the readout layer 103. On the other hand, the temperature in the portion corresponding to the vicinity of the light spot 109 is below $T_1$, and thus in-plane magnetization is maintained (FIG. 24($a$)). As a result, with respect to the light beam irradiated in a direction perpendicular to the film surface, the polar Kerr rotation effect is not shown.

As described, when a transition occurs from in-plane magnetization to perpendicular magnetization in the portion having a temperature rise, only the central portion of the light spot 109 shows the polar Kerr rotation effect, and the information recorded on the recording layer 104 is reproduced based on the reflected light from the irradiated area.

When the light spot 109 is shifted (in practice, the magneto-optical disk is rotated) so as to reproduce the next recording bit, the temperature of the previous bit drops below $T_1$ and the transition occurs from perpendicular magnetization to in-plane magnetization. Accordingly, the polar Kerr effect is no longer shown in the spot having the temperature drop. Therefore, information is no longer reproduced from the spot having the temperature drop and thus interference by signals from the adjoining bits, which causes noise, can be eliminated.

As described, the magneto-optical disk permits a reproduction of a recording bit with a size smaller than the diameter of the light beam 7 without being affected by the adjoining recording bits, thereby achieving a significant improvement in the recording density.

In the embodiment of the high density magneto-optical disk, the inventors of the present invention disclose the properties and effects in the "Proceedings of Magneto-optical Recording International Symposium' 92, J. Magn. Soc. Jpn., Vol. 17, Supplement No. S1 (1993), pp. 201–204, "Super Resolution Readout of Magneto-Optical Disk with an In-plane Magnetization Layer".

In the publication, in the recording medium having the arrangement shown in FIG. 22, GdFeCo is used as the readout layer 103, and DyFeCo is used as the recording layer 104. GdFeCo has such properties that the composition range that shows perpendicular magnetization is extremely narrow (shown by A in FIG. 23), and in which a transition suddenly occurs from in-plane magnetization to perpendicular magnetization. Therefore, GdFeCo is a suitable material for the recording medium of high intensity. FIG. 25 shows a temperature dependency of the polar Kerr rotation angle measured from the side of the readout layer of the recording medium. Here, the threshold temperature at which a transition occurs from in-plane magnetization to perpendicular magnetization is around 100° C. At temperature below 100° C., since in-plane magnetization is shown, the polar Kerr rotation angle is extremely small. In the vicinity of 100° C., since a transition suddenly occurs from in-plane magnetization to perpendicular magnetization, the polar Kerr rotation angle suddenly increases.

The described threshold temperature is an important factor that determines the reproduction laser power in reproducing a signal by the laser beam. FIG. 26 is a graph which shows the relationship between the reproducing laser power and the amplitude of the reproducing signal in the recording medium. As shown in the graph, the signal amplitude suddenly increases with an increase in the reproducing laser power, and is maximized at around 2 mW–2.3 mW. From the above-mentioned principle, it can be seen that a signal can be achieved only after the area having a temperature above 100° C. appears in the reproducing light spot. As can be seen from the graph, when the threshold temperature is set to 100° C., a desirable reproducing power is in a range of 2 mW–2.3 mW. When the threshold temperature is above 100° C., the reproducing power is required. However, when the reproducing power becomes too high, unwanted recording may occur by the reproducing power, and the information may be destroyed. On the other hand, when the threshold temperature is set below 100° C., information can be reproduced with a lower reproducing power. However, when the threshold temperature is set too low, i.e., around 40° C., the environmental temperature for reproducing is set to 40° C., the temperature in the entire spot becomes above 40° C., and the reproduction of high resolution cannot be achieved.

As described, in the magneto-optical recording medium, it is important to control the threshold temperature at which a transition occurs from in-plane magnetization to perpendicular magnetization.

In addition, when reproducing, in an area having a temperature above the threshold temperature, it is required that the magnetization in the recording layer is surely copied to the readout layer (in a direction perpendicular to the film surface, upward or downward). In other words, the magnetization direction (upward or downward) in the recording layer is copied to the portion subject to perpendicular magnetization of the readout layer.

The above conditions can be achieved by controlling each composition based on the magnetic interaction between the magnetic layers (the readout layer and the recording layer).

In order to stabilize the recorded information, it is required that the coercive force at room temperature is large, and also required to have such a Curie temperature that an extremely large laser power is not required for recording.

Although the objective is not to achieve a reproduction of high resolution by the magnetic supper resolution, the magneto-optical medium having a recording film of multi-layer structure has been proposed. For example, Japanese Examined Patent Publication No. 35371/1990 (Tokukohei 35371-2) discloses a magneto-optical recording medium having a magnetic layer of double-layer structure, which prevents the reproducing signal quality (S/N ratio) from being lowered even when the recording power is lowered, and as an example of the recording medium, which stabilizes the recorded information with respect to the external magnetic field. The magneto-optical recording medium is composed of the magnetic layer having a high Curie temperature of above 200° C., made of amorphous alloy including Gd-Fe, or Gd-Co and small coercive force (the magnetic layer corresponding to the readout layer) and magnetic layer made of Tb-Fe or Dy-Fe having a low Curie temperature, i.e., in a range of 200° C. to 50° C. and large coercive force, and the magnetic layer of large coercive force and the magnetic layer of small coercive force are exchange coupled.

As one effect of the configuration, since the magnetic layer having small coercive force and high Curie temperature that is exchange coupled with the magnetic layer of large coercive force, information can be read from the magnetic layer of small coercive force, and in the reproducing operation, a desirable S/N ratio can be achieved.

In the previously explained magneto-optical recording medium, in order to achieve a still higher recording density, it is required to improve the quality of the reproducing signal when reproducing. In the magneto-optical disk, from the reproduction principle, a larger the Kerr rotation angle is, a greater the reproducing signal is.

Therefore, by making the polar Kerr rotation angle of the readout layer (hereinafter referred to as θK) larger, a signal quality can be improved.

Like GdFeCo, the RE-TM (rear-earth-transition metal) alloy thin film using FeCo as a transition metal, a greater θk can be achieved by increasing the proportion (density) of Co in FeCo.

However, by laminating the readout layer onto the recording layer having an increased Co density, for example, in the recording medium which enables a reproduction of high resolution, the threshold temperature at which a transition occurs from in-plane magnetization to perpendicular magnetization is shifted to the side of high temperature, that is a main factor for enabling a reproducing operation of high resolution is shifted to the side of high temperature, and the laser power required for reproduction increases. Not only the problem that the life of the laser becomes shorter, if the threshold temperature is too high, the problem arises also in that the reproducing power becomes excessive, which may destroy the recorded information when reproducing.

Moreover, in the case of the Japanese Examined Patent Publication No. 35371/1990 (Tokukohei 2-35371), when the readout layer (corresponding to the magnetic layer of small coercive force) subject to the varying composition on the recording layer (corresponding to the magnetic layer of large coercive force), the exchange copying force varies. The exchange coupling force which is an important factor in determining the desirability of the reproducing operation from the recording medium, from which recorded information is readout from the magnetic layer of small coercive force by the exchange coupling force from the magnetic layer of large coercive force (see column 5, line 43—column 6, line 1). When the exchange coupling force varies, the problem of incomplete reproducing or recording operation arises.

In the case of using other recording medium having a plurality of magnetic layers on or from which a recording or reproducing operation is performed using the magnetic interaction between the magnetic layers (including an exchange coupling force), the above-mentioned problems presented are equally presented.

SUMMARY OF THE INVENTION

An object of the present invention is to provide a magneto-optical recording medium including a plurality of magnetic layers, for recording thereon and reproducing therefrom information using a magnetic interaction between the magnetic layers, which enables an improved signal quality.

In order to achieve the above object, the magneto-optical recording medium in accordance with the present invention includes: a plurality of magnetic layers including at least two magneto-optical layers of a readout layer for reading out information, and a recording layer for recording thereon information, for recording thereon and reproducing therefrom information using a magnetic interaction between magnetic layers, the magneto-optical recording medium being characterized in that the readout layer has a varying composition in a direction perpendicular to the surface thereof in such a manner that the Curie temperature on the reproducing light incident side is higher than the Curie temperature on the side of the recording layer.

According to the above-mentioned arrangement, by setting the Curie temperature on the reproducing light incident side of the readout layer higher, a larger polar Kerr rotation angle can be achieved when reproducing, thereby achieving an improvement in signal quality. In this case, the Curie temperature on the recording layer side of the readout layer remains the same, the magnetic interaction between the readout layer and the recording layer or another magnetic layer formed between the readout layer and the recording layer can be suppressed.

Especially, when the present invention is applied to the magneto-optical recording medium designed for a reproduction of high resolution, including the readout layer which is in in-plane magnetization at room temperature and the recording layer for recording thereon information magneto-optically, the magnetic interaction between the readout layer and the magnetic layer on the side of the recording layer can be suppressed, the threshold temperature being an important factor for high resolution reproduction, at which a transition occurs from in-plane magnetization to perpendicular magnetization will not be raised by performing a high resolution reproducing operation. Therefore, without greatly changing the laser power required for reproduction, a high quality reproducing signal can be achieved.

For the readout layer, it is preferable that the rare-earth transition metal including Co is used. In this case by varying the Co density in the film direction, a varying Curie temperature in a direction perpendicular to the film surface can be achieved.

A method for manufacturing the magneto-optical recording medium in accordance with the present invention is characterized by including:

the first step for preparing a substrate transiting type sputtering device for forming a thin film on the surface of the substrate while moving the substrate relative to a target in a predetermined direction; and the second step for forming the readout layer on the substrate using the sputtering device.

The above method is characterized in that in the second step, the composition of the target for use in forming the readout layer on the electrode differs between the side from which the substrate passes into the target and the side from which the substrate passes through the target.

When the described manufacturing method of the present invention is applied to the substrate transmitting-type sputtering device, the readout layer which varies in a direction perpendicular to the film surface can be desirably manufactured. Moreover, the number of target electrodes is not required to be increased. Namely, the readout layer of the present invention can be desirably manufactured using a single target electrode. Therefore, the problems that the sputtering device becomes larger in size and the cost increases can be prevented, thereby achieving a desirable method for manufacturing the magneto-optical recording medium.

Another method for manufacturing the magneto-optical recording medium includes:

the first step for preparing the sputtering device for forming a thin film on the substrate confronting the target on the substrate; and the second step for forming the readout layer on the substrate using the sputtering device.

The method is characterized in that in the second step, the Co-sputtering method for forming a film by supplying sputtering power to a plurality of mono targets simultaneously is employed, wherein the plurality of mono targets can be discharged simultaneously in the same sputtering chamber, a plurality of alloy targets made of the same material but of different compositions are placed, and after completing the initial stage of the film forming process by discharging the alloy target having a composition of high Curie temperature, the target to be discharged is switched from a target having a higher Curie temperature to a target having a lower Curie temperature, thereby forming the readout layer.

When the described manufacturing method is applied, without providing the sputtering chamber separately, the layer which has a varying composition in the direction perpendicular to the surface of the layer can be formed in the same sputtering chamber. Therefore, the problems that the sputtering device becomes larger in size and that the manufacturing cost increases, thereby achieving a desirable method for manufacturing the magneto-optical recording medium.

For a fuller understanding of the nature and advantages of the invention, reference should be made to the ensuring detailed description taken in conjunction with the accompanying drawings.

BRIEF DESCRIPTION OF THE DRAWINGS

FIG. 7(a) and FIG. 7(b) show one method for manufacturing the magneto-optical recording medium of the present invention, wherein:

FIG. 7(a) is a plan view showing a schematic configuration of a substrate transmitting-type sputtering device for use in the manufacturing method; and FIG. 7(b) is a cross sectional view showing a target electrode of the sputtering device.

FIG. 9(a) and FIG. 9(b) show another method for manufacturing the magneto-optical recording medium of the present invention, wherein:

FIG. 9(a) is a plan view showing a schematic configuration of a substrate transmitting type sputtering device for use in the manufacturing method; and FIG. 9(b) is a cross sectional view showing a target electrode of the sputtering device.

FIG. 11(a) and FIG. 11(b) show a sputtering chamber in which the readout layer is formed in the rotatable sputtering device of FIG. 10, wherein FIG. 11(a) is a plan view schematically showing inside the sputtering chamber; and FIG. 11(b) is a cross sectional view showing the target electrode in the sputtering chamber.

FIG. 12(a) and FIG. 12(b) are explanatory views showing another manufacturing method of the magneto-optical recording medium in accordance with the present invention, wherein:

FIG. 12(a) is a plan view showing inside the sputtering chamber in which the readout layer is formed in the rotatable sputtering device for use in the manufacturing method in accordance with the present invention; and FIG. 12(b) is a cross sectional view showing the target electrode in the sputtering chamber.

DESCRIPTION OF THE EMBODIMENTS

Figure 1:
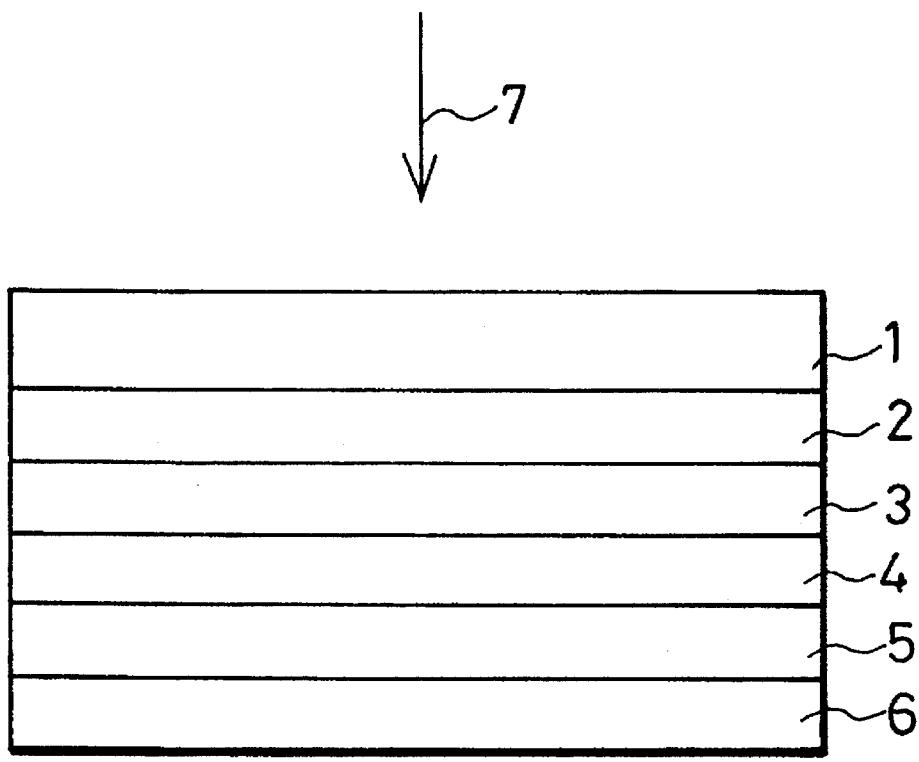
FIG. 1 which shows one embodiment of the present invention is an explanatory view showing a schematic configuration of a magneto-optical recording medium.

The configuration of a magneto-optical recording medium in accordance with the present invention will be explained below with reference to the cross sectional view of FIG. 1.

A light transmitting substrate 1 may be a grass substrate or a substrate made of synthetic resin such as polycarbonate, acrylic, amorphous polyolefine, etc. On one surface of the substrate, a guide truck for guiding a light beam is formed. As a transparent dielectric film 2, AlN is formed with a thickness of 80 nm on the light transmitting substrate 1 on the side where a guide track is formed.

On the transparent dielectric film 2, a readout layer 3 made of GdFeCo with a varying composition in a direction perpendicular to the film surface is formed with a thickness of 50 nm. The readout layer 3 made of GdFeCo is manufactured by a method (to be described later) in such a manner that in FeCo of Gd(FeCo), the ratio of Fe to Co varies in a direction perpendicular to the film surface. More specifically, the Co density on the reproduction-use light incident side through which a reproduction-use light beam 7 is incident, i.e., the Co density on the side of the transparent substrate 1 is set higher than the Co density on the side of the recording layer 4. In this way, Curie temperature of the readout layer 3 can be set higher on the light incident side than the side of the recording layer 4.

On the readout layer 3, the recording layer 4 made of DyFeCo with a thickness of 50 nm is formed. Further, on the recording layer 4, a protective layer 5 made of AlN with a thickness of 20 nm is formed. On the protective layer 5, an overcoat layer 6 is formed with a thickness of 5 μm.

The layers 2–5 are respectively formed by sputtering, and the overcoat layer 6 is formed by projecting an ultraviolet ray after applying thereto resin by a spin coating machine.

The readout layer 3 made of GdFeCo in the present embodiment is analyzed by an Auger electron spectrum method in order to see the varying composition in the direction perpendicular to the film surface. The sample used in the analysis made of electrically conductive Si wafer, whereon an AlN transparent dielectric layer (80 nm), the readout layer made of GdFeCo (50 nm) and Al electrically conductive layer (30 nm) are formed in this order.

Figure 2:
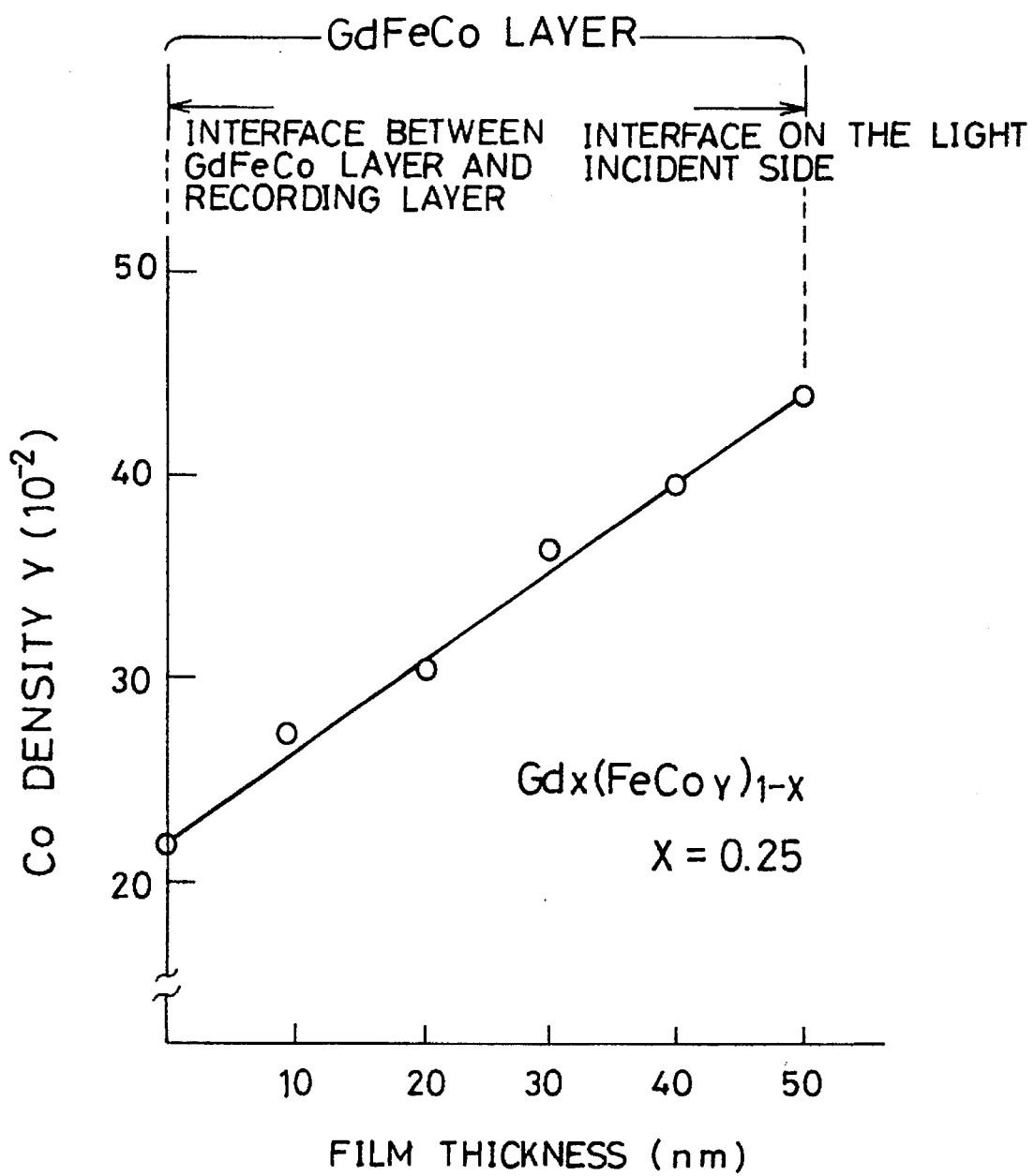
FIG. 2 is a graph showing the result of analysis of Co density in the direction perpendicular to surface of a readout layer of the magneto-optical recording medium in accordance with the present invention.

The results of the Auger analysis are shown in FIG. 2. In FIG. 2, x-axis indicates the depth corresponding to the readout layer (50 nm). In FIG. 2, y-axis indicates Co density Y in $Cd_x(Fe_{1-Y}Co_Y)_{1-x}$. The point of the film thickness zero corresponds to the interface between the readout layer made of GdFeCo and the recording layer, the film thickness 50 nm corresponds to the interface on the light incident side. As can be seen from the figure, the Co density varies along the linear line. Moreover, on the interface from the recording layer, the Co density Y is 0.22, and on the interface on the light incident side, Y=0.44, this suggests the Co density inclination of 0.22/50 nm. From this sample, almost no variation of the Gd density in the direction perpendicular to the film surface was observed, and the resulted Gd density was X=0.25.

Including the Co density Y in FIG. 2, composite values in the specification are based on the values in the XRF analysis. Based on the results of analysis of a separately provided calibrating sample, the relationship between the Auger analysis value and the XRF analysis value was investigated, and the detected density of each element in the Auger analysis (Gd, Fe or Co) was converted to the XRF analysis value. In the XRF analysis, since an X ray of significantly higher intensity is applied to the sample compared with the case of the Auger analysis, the X ray reaches to the deeper portion of the sample. Like the sample of the present embodiment, in the case where the total thickness of the recording medium thin film (excluding the overcoat film 6) is 200 nm, the X-ray reaches to the glass substrate, and for example, Si that is a component in glass may be detected. As described, the XRF analysis is simple and requires only a short period of time. However, since the X-ray reaches the deeper portion, it is difficult to detect a varying composition in the direction perpendicular to the surface of the layer, and the average value in the film thickness can be detected.

The composition of DyFeCo in the recording layer 4 is $Dy_{0.23}(Fe_{0.78}Co_{0.22})_{0.77}$, and the Curie temperature is 210° C. Here, it is required that Curie temperature is high enough to prevent the recorded information from being disturbed by the reproducing laser power which may cause unwanted recording. On the other hand, it is required that the Curie temperature is low enough to ensure the recording operation by an appropriate recording laser power in recording information. The density can be adjusted by varying the Dy density or Co density (details will be described later).

The effects achieved from the magneto-optical recording medium in accordance with the present invention will be explained below by comparing with the magneto-optical recording medium with the conventional magneto-optical examples.

COMPARATIVE EXPERIMENT 1

As previously explained under "BACKGROUND OF THE INVENTION", in the magneto-optical recording medium, it is very important to control the threshold temperature at which a transition occurs from in-plane magnetization to perpendicular magnetization. In the magneto-optical recording medium of the present invention, while maintaining the threshold temperature at which a desirable reproducing laser power can be ensured, the polar Kerr rotation angle can be made larger.

The effects that can be achieved from the present invention are confirmed by the following experiments.

The following sample of the magneto-optical recording medium of the present embodiment was prepared in the previously described manner except that a micro sheet glass with a thickness of 0.5 mm is used as a transparent substrate 1, and the overcoat layer 6 is not provided because it would be melted when measuring the magnetic properties at high temperature.

The conventional sample 1 as a conventional example used in comparing the properties, is the same as the sample of the present embodiment in the lamination structure of the medium, materials, and film thickness, except that the composition of GdFeCo in the readout layer does not vary in a direction perpendicular to the film surface. The Co density of the conventional sample is fixed at Y=0.22. This is the same as the GdFeCo used in the readout layer 3 in the sample of the present embodiment on the side of the recording layer 4.

Figure 3:
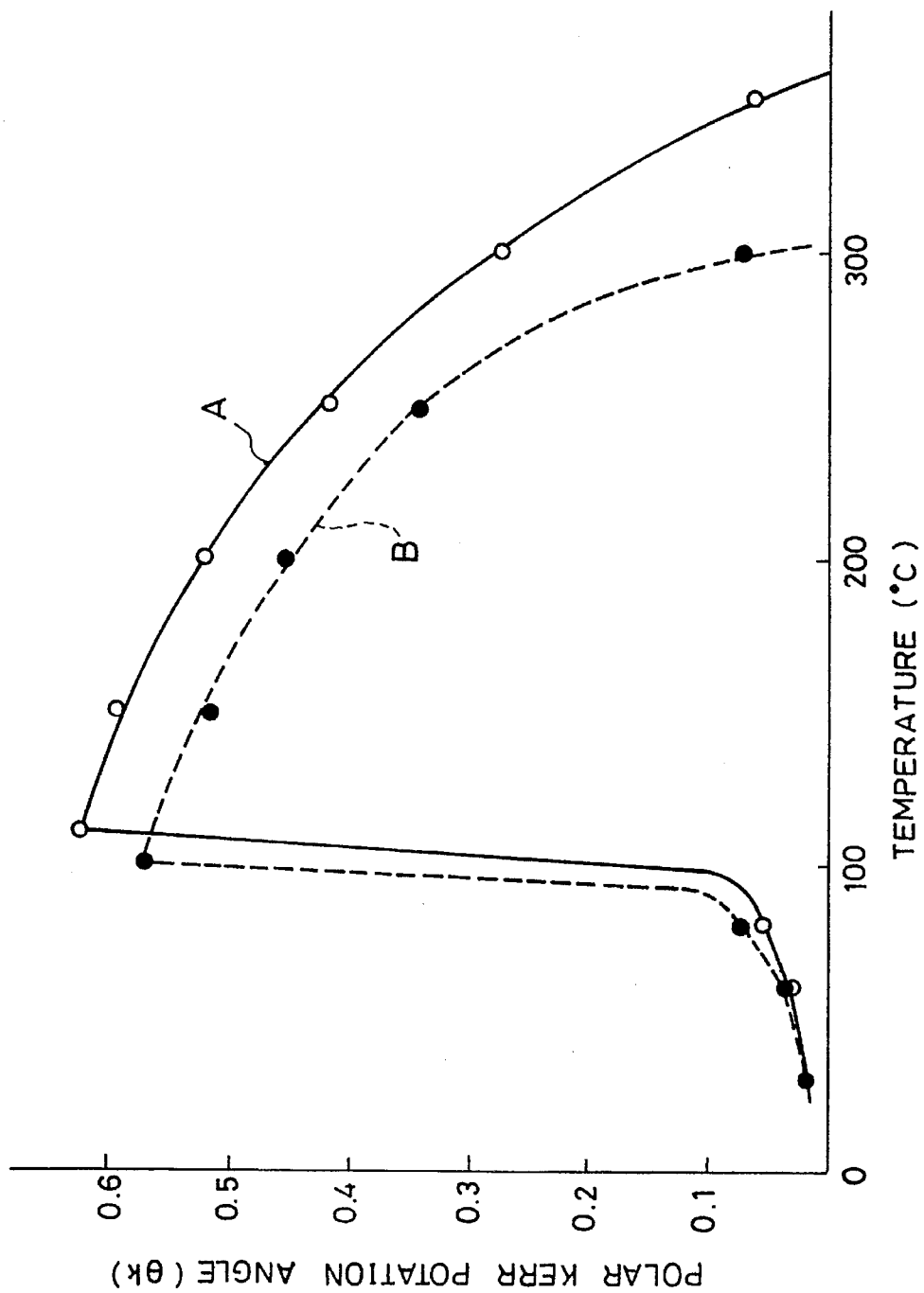
FIG. 3 is a graph showing differences in temperature dependency of the polar Kerr rotation between the magneto-optical recording medium of the present invention and the conventional magneto-optical recording medium.

The Gd density of the conventional sample 1 was set to the same Gd density as the sample of the present invention, i.e., X=0.25. FIG. 3 is a graph showing the results of measurement of the temperature dependency of the Kerr rotation angle (hereinafter referred to as θk) with respect to both the sample of the present embodiment and the conventional sample 1.

In the figure, the results of measurements of the sample of the present embodiment are shown by A, and the results of measurements of the conventional sample 1 are shown by B. As shown in FIG. 3, there was no significant difference between the threshold temperature of the sample of the present embodiment and the threshold temperature of the conventional sample 1.

From the sample of the present embodiment, Curie temperature of 360° C. was observed that was about 60° C. higher than Curie temperature of the conventional sample. In response to this increase in temperature, for example, the θk at 110° C. was increased by about 10% than the conventional sample 1.

Namely, the Co density on the interface between the readout layer 3 and the recording layer 4 was set to the same density as that of the conventional sample, and the Co density on the light incident side is set higher. It can be confirmed that the threshold temperature from in-plane magnetization to perpendicular magnetization that is affected by the magnetic interaction of the sample of the present invention having the described arrangement is the same as the conventional sample. This feature is an essential feature of the present invention. In addition to the effect, it can be also confirmed that the θk also increases.

Next, laser power required in reproducing the sample and qualities of a reproducing signal are measured as explained below. Since this measurement was a dynamic measurement, each sample had the same arrangement as the previously described arrangement except that a disk-shaped glass substrate with a thickness of 1.2 mm, and a diameter of 86 mm was used and that an overcoat film 6 was formed on the protective layer 5.

On the substrate, grooves and lands were formed beforehand with a depth of 50 nm and a track pitch of 1.4 μm so that a groove and a land had the same width by a dry etching method, and on both sides of the faces whereon the grooves were formed, recording films were formed.

The results of the measurements are as summarized in the Table 1. Since both of the sample of the present embodiment and the conventional sample had the threshold temperature of around 100° C., appropriate reproducing power was also the same. Moreover, since the Curie temperature was increased by θk, the reproducing signal quality (C/N) of the sample of the present embodiment was higher than the conventional sample by about 1.5 dB. The measurement was carried out under the condition that the disk linear velocity of 5 m/s, and the recording bit length of 0.55 μm.

TABLE 1

Results of Measurements for Comparison

| | Optimal Reproducing Laser Power | C/N of Reproducing Signal |
|---|---|---|
| Conventional Sample 1 | 2 mW–2.3 mW | 44.5 dB |
| Sample of the Present Invention | 2 mW–2.3 mW | 46.0 dB |

COMPARATIVE EXPERIMENT 2

The GdFeCo layer in which only the Co density is increased present the problems as evidenced using the following conventional sample 2.

The conventional example 2 was prepared as an example of the conventional magneto-optical recording medium in the following manner.

The conventional sample 2 had the same as the sample of the present embodiment in terms of its laminating structure, the material used in each layer and the thickness of each layer. However, in the conventional sample 2, a micro sheet was used for the substrate, and the overcoat layer 6 was not formed. In the conventional sample 2, the composition of the GdFeCo readout layer was not varied in a direction perpendicular to the film surface on purpose, and the arrangement thereof differs from the sample of the present embodiment only in that the Co density was set higher than the conventional sample 1.

The Co density of the conventional sample 2 was the same as the Co density (Y=0.40) on the light incident side of the GdFeCo readout layer in the sample of the present embodiment.

The Gd density was set to the same density as the Gd density (X=0.25) of the GdFeCo readout layer on the light incident side of the sample of the present embodiment.

Figure 4:
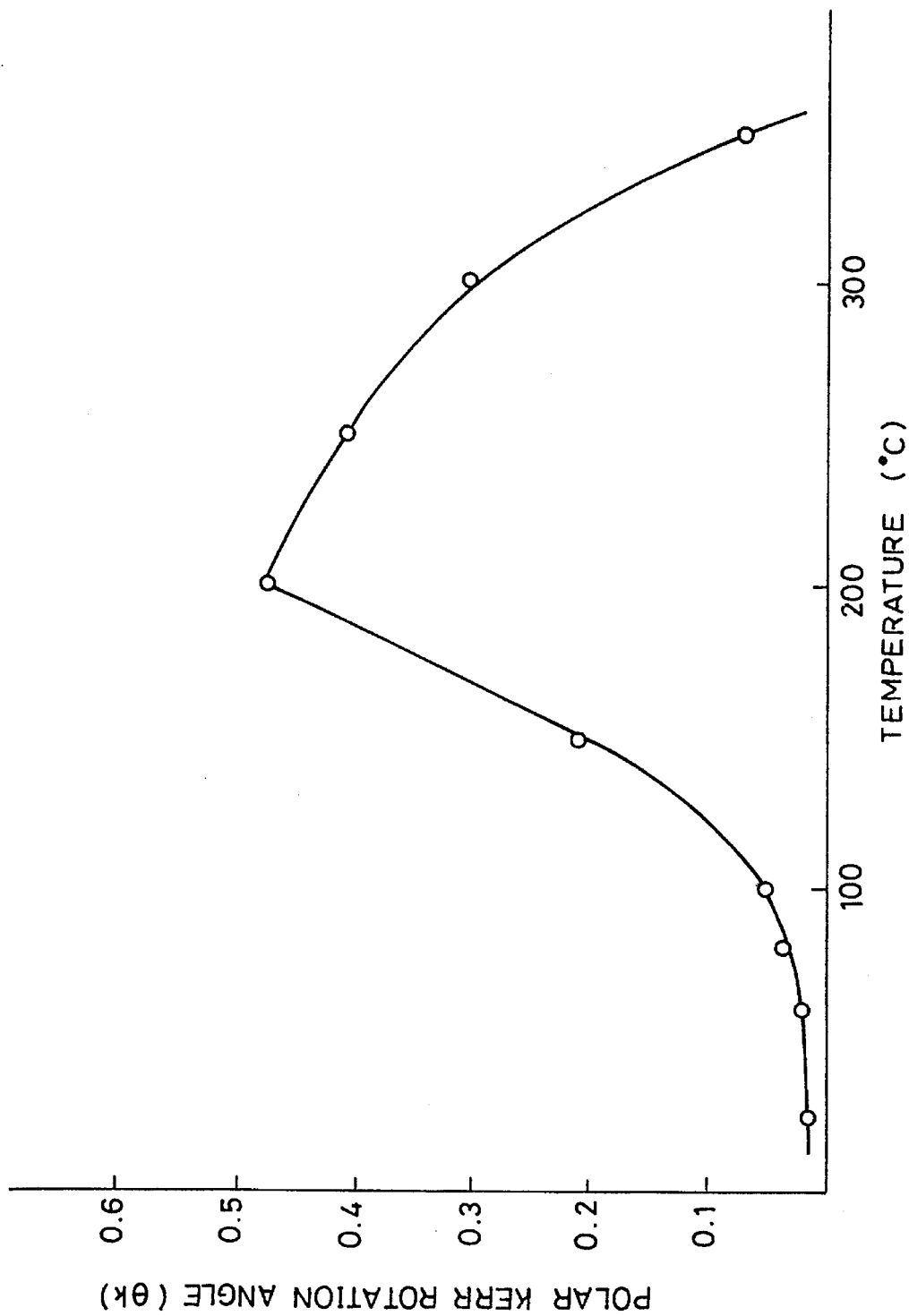
FIG. 4 is a graph showing a temperature dependency of the polar Kerr rotation angle of the conventional magneto-optical recording medium as a comparative example of the magneto-optical recording medium of the present invention.

FIG. 4 was a graph showing the results of measurements on the temperature dependencies of the θk of the conventional sample 2. The θk was maximized at temperature of around 200° C., and that was higher compared with that of the sample 1 or the sample of the present invention (around 100° C.). The Curie temperature 200° C. of the readout layer 3 was the same as the DyFeCo layer (recording layer). This means that the problem of unwanted recording occurred when the reproducing laser power was applied. When FIG. 4 and FIG. 3 are compared, the conventional sample 2 shown in FIG. 4 shows a gradual increase in the rising of the θk at a temperature below the threshold temperature. This suggests that by increasing a noise in reproducing, the signal quality was lowered.

From the results of the comparative experiment 2, desired properties cannot be achieved by employing a GdFeCo readout layer in which only the Co density was raised.

The following will explain an appropriate composition range for a GdFeCo readout layer of the present invention. The explanations will be given through the following composition $Gd_x(Fe_{1-y}Co_y)_{1-x}$.

Figure 5:
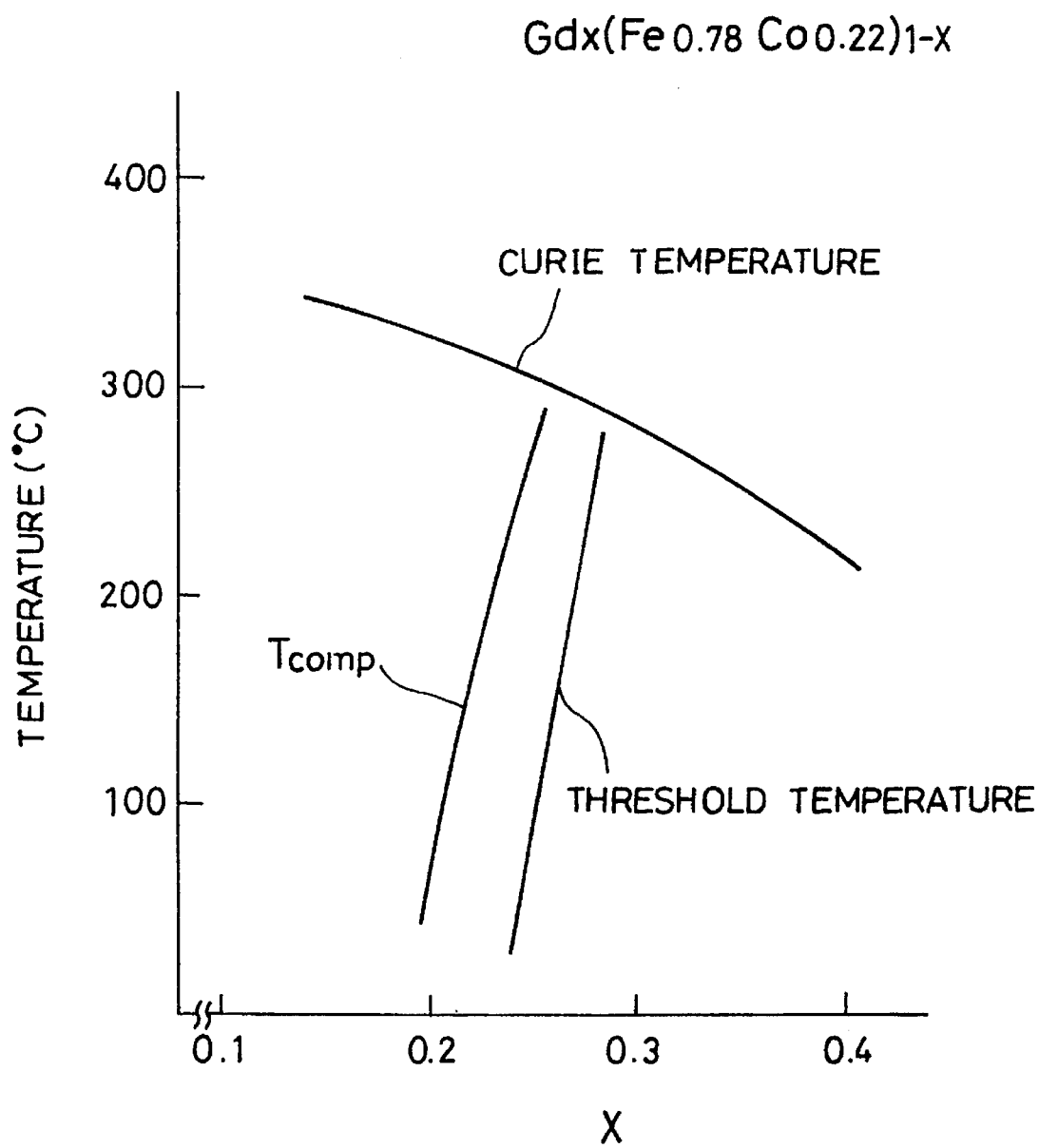
FIG. 5 is a graph showing a relationship between the composition of the readout layer and the magnetic properties (Curie temperature, magnetic compensating temperature, threshold temperature) in accordance with the present invention.
Figure 6:
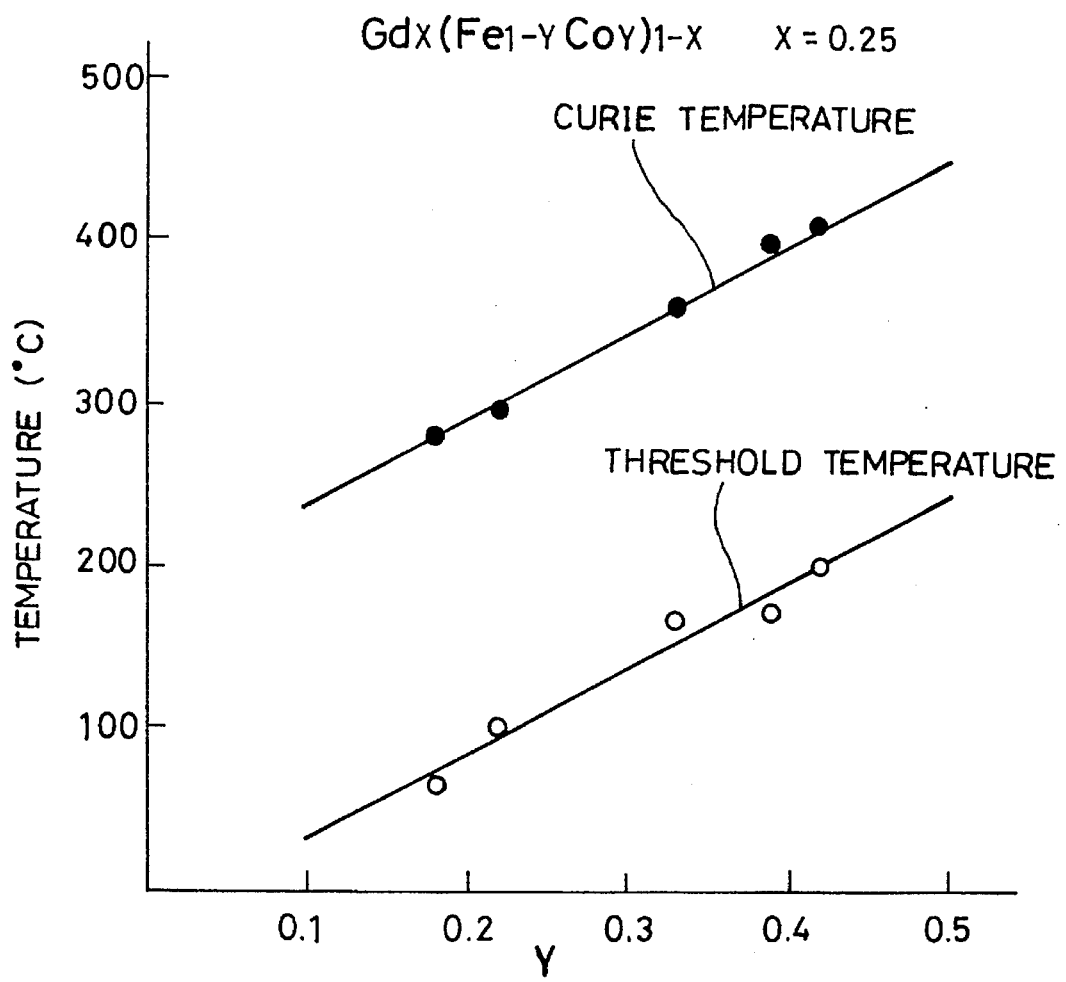
FIG. 6 is a graph showing a relationship between the composition of the readout layer of the present invention and the magnetic properties (Curie temperature, magnetic compensating temperature, threshold temperature).

FIG. 5 in which the x-axis indicates the Gd density X, shows changes in Curie temperature, threshold temperature at which a transition occurs from in-plane magnetization to perpendicular magnetization and Tcomp (magnetic compensation temperature; temperature subject to hysteresis inversion). FIG. 6 is a graph showing changes in Curie temperature and threshold temperature. In FIG. 6, x axis shows a Co density Y.

In the present invention, the Gd density is preferably around X=0.25 ±0.05. This is because if the threshold temperature is not above room temperature, a reproducing operation with high resolution cannot be achieved. If the threshold temperature is not below 200° C., the reproducing laser power becomes too high, and the problem may be presented in that unwanted recording on the recording layer would occur during reproduction or the life of the laser is shortened. FIG. 5 is a graph which shows the state where the Co density Y=0.22. Considering that when the Co density Y varies, Curie temperature and the threshold temperature also vary, the above range is preferable.

Next, in the case where the Co density Y is in a preferable range, but the Gd density X is 0.25 will be explained. Here, the Co density on the side of the recording layer 4 is set to Yr, and the Co density on the light incident side of the readout layer 3 is set to Yi.

First, the Co density on the interface between the readout layer and the recording layer is Yr which is preferably in the range of 0.1≦Yr<0.40. As a result of the experiment (comparative experiment 2), when Yr is set to 0.4, the threshold temperature increases to about 200° C., and unwanted recording on the recording layer during reproduction may occur. In order to set the threshold temperature above room temperature, it is required to satisfy $0.1 \leq Yr$ as obtained from FIG. 6.

Next, the Co density Yi on the light incident side is preferably in the range of $0.1<Yi<0.5$. Needless to say, the Co density Yi on the light incident side is higher than the Yr on the interface between the recording layer and the readout layer. Here, by setting the Yi higher than Yr even by a small amount, the Curie temperature relatively increases along the linear line shown in FIG. 6, $\theta k$ increases accordingly, thereby achieving an improvement in signal quality. In the present embodiment, the density gradient is set to 0.22/50 nm. It is possible that the density gradient is set above 0.22/50 nm. However, if Yi increases, in-plane magnetic anisotropy becomes too high, and as shown in FIG. 4, a transition from in-plane magnetization to perpendicular magnetization gradually occurs. Therefore, it is preferable that Yi is below 0.5 in practical applications.

In the recording medium having the arrangement of the present embodiment, Curie temperature Tc of the DyFeCo recording layer is set above 200° C. for the following reason.

As previously described, it is required that the Curie temperature of the recording layer 4 is set high enough to prevent an unwanted recording when a reproducing laser power is applied in reproducing information. The preferable Curie temperature of the recording layer in the arrangement of the present invention was examined, and the results as shown below were obtained.

In the sample of the present embodiment, a transition occurs from in-plane magnetization to perpendicular magnetization in the GdFeCo readout layer 3 at 100° C. The Curie temperature of the DyFeCo recording layer 4 may be set to 210° C. As previously explained, an optimal reproducing laser power for high resolution reproduction in this sample was in a range of 2 mW–2.3 mW. It was confirmed that unwanted recording on the recording layer would not occur. When the reproducing power was raised above an optimal reproducing power, unwanted recording on the recording layer occurred when a laser power above 3.5 mW was applied, thereby disturbing the recorded information.

Next, a comparative sample was prepared having the same arrangement as the sample of the present embodiment except that Curie temperature was 175° C. The optimum reproducing laser power was the same as that of the sample of the present embodiment, i.e., in the range of 2 mW–2.3 mW. When the reproducing power was raised above 2.6 mW, an unwanted recording occurred. The margin with respect to the reproducing power was around 1.2 mW in the sample of the present embodiment, while in the comparative sample, the reproducing power was small (around 0.3 mW).

In the present embodiment, explanations have been given through the case where the threshold temperature was set to 100° C. However, depending on the environmental temperature in reproducing, it may be desirable to set the threshold temperature above 100° C. For example, in the case where the magneto-optical recording and reproducing device in which the recording medium of the present embodiment is applied is installed in a car parked in a really hot summer day, the environmental temperature may be 60°–80° C., and this environmental temperature is higher than the room temperature (around 25° C.) by more than 50° C. Since the experiment of the present embodiment was carried out at room temperature, the threshold temperature of the readout layer may be set around 150° C. in order to ensure a desirable reproduction with high resolution even when an environmental temperature is 60°–80° C.

Needless to say, when the threshold temperature was raised from 100° C. to 150° C., a higher optimal reproducing laser power is required. In the experiment, when the threshold temperature was set to 150° C., the laser power of abound 3 mW–3.3 mW was required. When the laser power in the above range was applied, unwanted recording occurred on the comparative sample having Curie temperature of 175° C. However, in the sample of the present embodiment having Curie temperature of 210° C., unwanted recording did not occur. Therefore, it is preferable that the Curie temperature of the recording layer is above 200° C.

In the sample of the present embodiment, the recording laser power required in recording is around 5 mW. (In the measurement shown in Table 1, a recording operation was performed by the generally known manner). This recording laser power was relatively low, and had an advantage in terms of the life of the laser. Moreover, even when the disk is rotated at high speed, a desirable recording can be ensured without the problem of lack of laser power, and the transportation rate can be increased. From the material and the arrangement employed in the present embodiment, even when the Curie temperature of the recording layer is set to 210° C., a sufficient recording sensitivity can be ensured as evidenced by the experiment.

The upper limit of the Curie temperature of the recording layer is set considering the recording laser power required for recording. More specifically, when the Curie temperature is too high, the recording power that is higher than the laser power in practical application is required. As previously described, the application is required. As previously described, the recording power in the sample of the present embodiment is around 5 mW with respect to the Curie temperature of 210° C., while in the comparative sample, the recording power is 4 mW with respect to the Curie temperature of 175° C. Considering the above, even when the Curie temperature is above 300° C., the recording power can be maintained in a suitable range for practical application (around 8 mW). However, in order to enable a high transportation rate, it is required to increase the number of rotations of the disk. Therefore, it is preferable that the upper limit of the Curie temperature of the recording layer is around 300° C.

[The Method for Manufacturing the Magneto-optical Recording Medium]

The following discusses the first embodiment related to the manufacturing method of the magneto-optical recording medium in accordance with the present invention.

The manufacturing method in accordance with the present embodiment is related to a method for forming recording medium thin films on the light transmitting substrate 1, i.e., the transparent dielectric film 2, the readout layer 3, the recording layer 4 and the protective layer 5 by the substrate transmitting type sputtering device. The sample of the present invention was manufactured by the following manner.

Here, the substrate transmitting type sputtering device suggests that when forming films, the substrate (light transmitting substrate 1) crosses the target.

The manufacturing method in accordance with the present embodiment is designed for manufacturing the readout layer 3 made of GdFeCo having a varying Co density in a direction perpendicular to the film surface.

Figure 7:
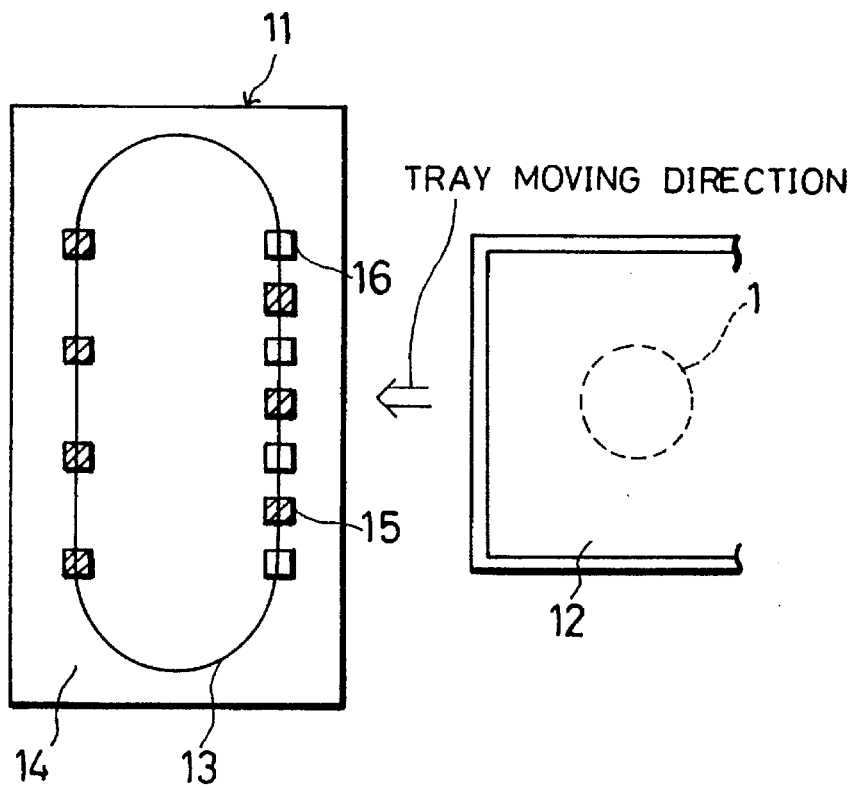
Figure 7:
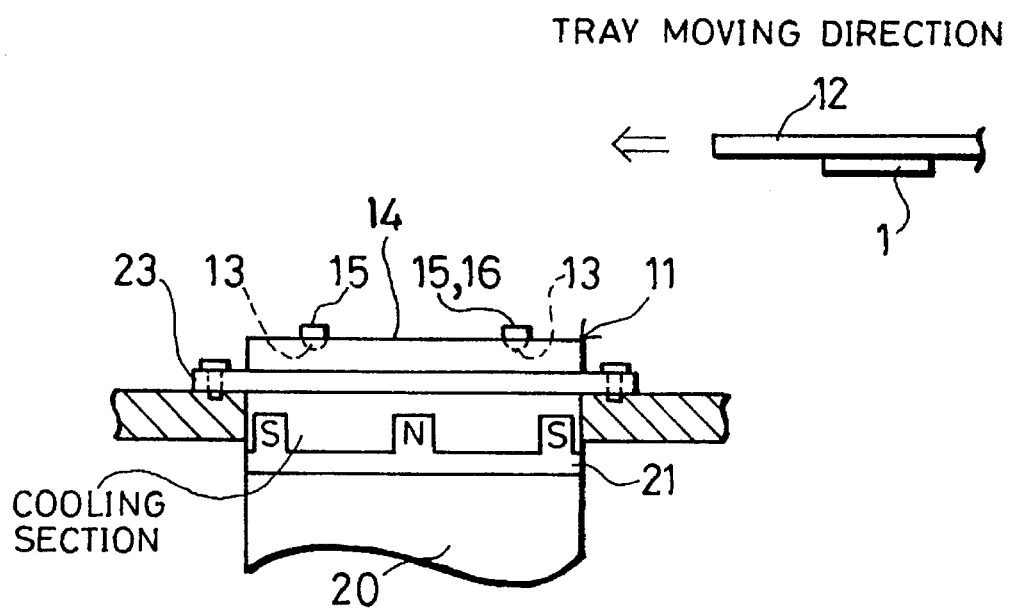

The following discusses the manufacturing method of mainly the readout layer 3 with reference to FIG. 7(a) and FIG. 7(b).

FIG. 7(a) is a schematic plan view taken from above the sputtering device. FIG. 7(b) is a schematic cross-sectional view of the target electrode section. The target for use in forming the readout layer 3 is designated by a reference numeral 11. The tray 12 provided with the light transmitting substrate 1 crosses the target 11 from the right end to the left end in the figure, so as to form the readout layer 3 on the substrate 1. (Here, for convenience in the explanation, a single light transmitting substrate 1 was prepared. However, a plurality of light transmitting substrates 1 may be used as well).

Needless to say, on the light transmitting substrate 1, the transparent dielectric film 2 is formed before forming the readout layer 3.

Next, the target 11 for use in forming the readout layer 3 will be explained.

Many sputtering devices employ the magnetron sputter which fastens the film forming rate, and in the present embodiment employs the sputtering device of this type that has the following arrangement. A target 11 bonded to a backing plate 23 is mounted on a sputtering electrode section 20 for supplying power such as DC or RF, etc., to the target 11. On the upper portion of the electrode section 20, a water cooling mechanism is provided for cooling the target using water. In this water cooling mechanism of the electrode section 20, a magnet 21 is fitted, or fixed via a detachable mechanism.

By the magnet 21, a magnetic leakage flux occurs in the vicinity of the surface of the target 11 which captures and houses the electron, and the plasma is converged, thereby increasing the sputtering efficiency. When the plasma is converged and the sputtering is selectively formed, an erosion 13 is formed.

The target 11 is composed of a base target 14 made of FeCo alloy, plate-like Gd chips 15 and plate-like Co chips 16 (for convenience in the explanation, in FIG. 7(a), the Gd chips 15 are shown by hatching, and the Co chips 16 are shown without hatching). On the erosion 13 formed on the FeCo base target 14, the Gd chips 15 and the Co chips 16 are mounted. By changing the size of the chips and the interval between the chips, the composition of the GdFeCo readout layer 3 can be varied. Needless to say, a varying composition of the GdFeCo readout layer 3 can be achieved when the FeCo base target 14 in which the ratio of Fe to Co was varied.

The feature of the manufacturing method in accordance with the present embodiment lies in that in the erosion 13, the Co chips 16 are placed only on the side where the tray 12 from which the tray starts passes into. Therefore, on the side where the formation of the readout layer 3 is initiated, i.e., on the side of the light transmitting substrate 1, the composition of the GdFeCo readout layer 3 is Co-rich. On the other hand, on the side where the tray 12 passes through, i.e., on the side of the recording layer 4 to be formed next, the composition of the readout layer 3 is Co-poor.

This is evidenced by the results of analysis of the composition in the direction perpendicular to the film surface shown in FIG. 2 as previously explained.

According to the experiment in the manufacturing method in accordance with the present invention, the ratio of Fe to Co of the FeCo base target 14 is set to the same ratio of the composition of the readout layer 3 on the interface between the readout layer 3 and the recording layer 4.

In the sample of the previous embodiment, the readout layer 3 is formed on the target 11.

According to the manufacturing method in accordance with the present embodiment, varying Co density in the direction perpendicular to the film surface can be achieved as is evidenced by the results of analysis of the composition previously discussed. The particular effects achieved from the manufacturing method of the present invention were also evidenced from the values showing the static properties and dynamic properties of the sample of the present embodiment.

The matter of concern regarding the manufacturing method of the present invention is that whether the unevenness in the composition distribution in the disk circumference direction is small enough to be ignored. This is the problem particular to the transmitting type sputtering device. However, when measuring the reproducing signal quality shown in Table 1, the problem that the intensity of the signal varies in the disk circumference direction would not occur, and the envelop of the reproducing signal becomes uneven. This suggests that the variation in the composition in the circumferential direction is small enough to be ignored.

When manufacturing the recording medium in accordance with the manufacturing method of the present invention, it is possible that the Co density on the interface between the GdFeCo readout layer 3 and the recording layer 4 is higher than the density desired. This occurs when the Co particle sputtered from the Co chips 16 placed on the side where the tray 12 starts passing into in the erosion 13 remain until the tray has passes through the substrate, i.e., until the interface between the readout layer and the recording layer. The described phenomenon may occur when the distance between the target 11 and the tray 12 changes, or the arrangement surrounding the target such as the shape of the plate (height, width, etc.) placed between the targets, for preventing them from being contaminated from one another changes. When an average jump distance of the particle sputtered becomes larger by reducing the sputtering gas pressure (in the present embodiment, Ar gas is applied to the magnetic layer, and $N_2$ gas is applied to the AlN as sputtering gas), the above phenomenon may also occur. The sputtering gas pressure is an important parameter in controlling the composition. Therefore, it is difficult to change the sputtering gas pressure for the purpose of eliminating the above-mentioned problem. In order to prevent the occurrence of the above problem, an increase in the Co density is compensated by lowering the Co density of the FeCo base target 14, or by using the FeCo base target 14 that is divided into two, the ratio of FeCo on the left hand side (on the side where the tray 12 passes into) is set lower than the Co density on the right hand side (on the side the tray 12 passes through).

According to the manufacturing method in accordance with the present embodiment, even when the Co chips are placed only on the right hand side of the erosion, the problem of the distribution in the disk circumferential direction would not occur. Moreover, a decrease in the inclination of the composition having the Co density is enabled by providing the Co chips of different shape (surface area) on both right and left hand sides of the erosion 13. Needless to mention, the Co chip on the side where the tray 12 passes into (right hand side) is set larger than the Co chips placed on the left hand side. Here, since the Co chips are placed also on the left and side, the Co density on the interface between the recording layer and the readout layer increases, the ratio of FeCo in the FeCo base target 14 should be varied accordingly.

Next, the preferable size of the Co chip will be explained.

In the plan view of FIG. 7(a), the erosion 13 is shown by a single line for simplification. However, as shown in the schematic cross-sectional view of FIG. 7(b), the erosion 13 has a certain width. The width is generally around 10 mm although it may be varied depending on the intensity of the leakage of the magnetic leakage flux on the surface of the target 14 which is determined by the strength of the magnet 21 and the magnetic permeability of the base target 14, sputtering conditions (supplied power in sputtering, sputtering gas pressure, etc.), change in the intensity of the magnetic leakage flux in sputtering, etc. According to the described manufacturing method, the Co chips 16 that can be stored within a space of the erosion was used. Therefore, the entire surface of the Co chips 16 can be sputtered, and a composition can be easily controlled. Moreover, as described, the envelope can be maintained uniform when reproducing, and the magneto-optical recording medium which ensures an excellent signal quality can be achieved.

The results of the comparative experiment conducted for proving the above-mentioned particular effects of the present invention are as explained below.

A comparative sample which employed a Co chip rectangular in shape having a surface larger than the width of the erosion 13 was prepared. Here, the width of the Co chip in a direction orthogonal to the tray passing direction (lengthwise direction of the target 11 shown in FIG. 7(a)) and an interval between chips are the same as those of the previously described manufacturing method. In this way, the composition distribution in a direction orthogonal to the tray transmitting direction is the same as that of the manufacturing method of the present embodiment. Although the comparative sample has a slightly higher Co density, and also higher threshold temperature, with a small increase in the reproducing laser power, the reproducing operation of information could be performed without destroying the recorded information. Evenness of the envelope was compared with that of the sample of the present embodiment. Namely, in order to see the difference in variations in composition in the circumference direction, the respective envelopes of the sample of the present embodiment and of the comparative reproducing signal were compared.

As the result of comparison, the comparative sample was inferior to the sample of the present embodiment in terms of the evenness of the envelope. This is because the intensity distribution of the magnetic field generated from the magnet 21 is not uniform, and the width of the erosion 13 is not uniform. By employing the Co chip 16 that can be stored in the erosion, a recording medium that shows a more uniform composition distribution can be manufactured.

In the case where the transmitting type sputtering device is employed in which a target is placed in a direction perpendicular to the ground, the Gd chip 15 and the Co chip 16 may be laminated on the base target 14 using a target bond for use in the vacuum device and the sputtering device only. Additionally, it is not necessary to laminate the Co chip 16 if the magnet 21 is strong enough, because the Co chip 16 is attracted to the base target 14 by the attraction by the magnetic field.

Another manufacturing method in accordance with the present embodiment will be explained in reference to FIG. 8.

Figure 8:
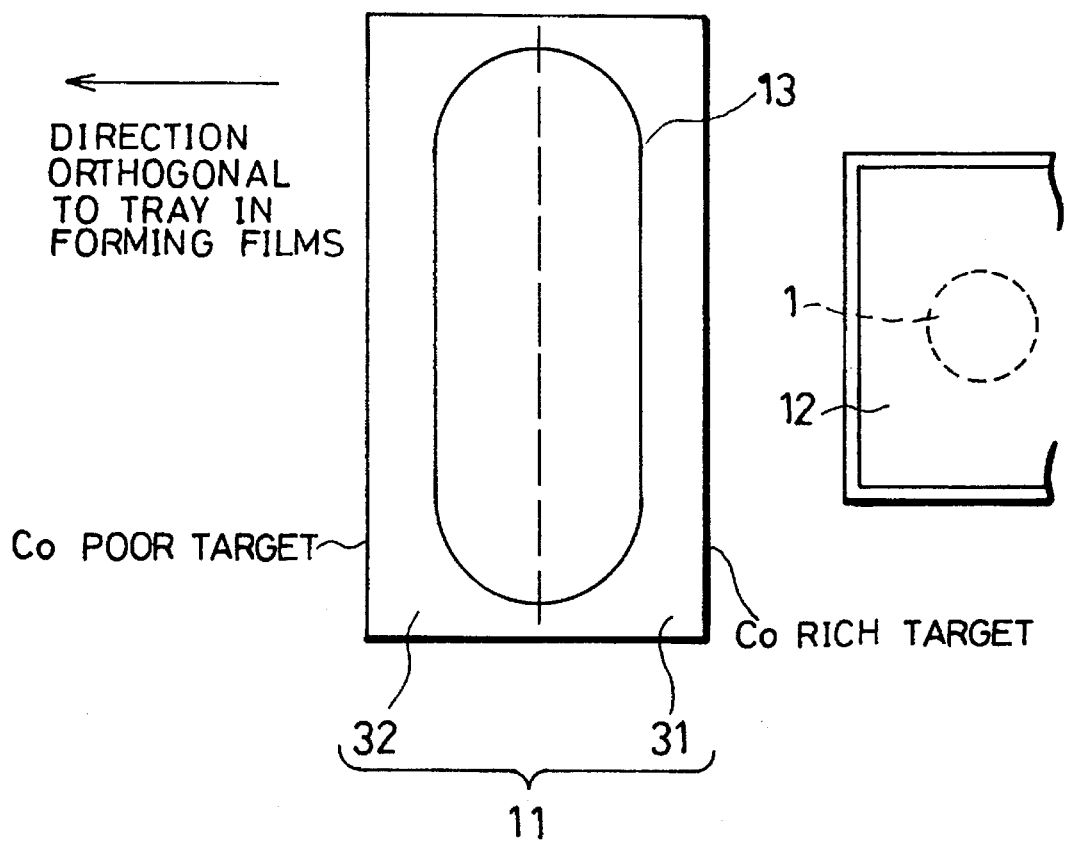
FIG. 8 is a plan view showing a schematic configuration of the sputtering target, which explains another method for manufacturing the magneto-optical recording medium of the present invention.

The manufacturing method of the present invention is characterized in that the target 11 for use in forming GdFeCo readout layer is composed of the GdFeCo alloy targets 31 and 32 as shown in FIG. 8.

The GdFeCo alloy target 31 that has a relatively higher Co density is placed on the side where the tray 12 passes into, and the GdFeCo alloy target 32 having a lower Co density is placed on the side where the tray 12 passes through. Since the portion where the erosion 13 is formed is race track shape shown in the figure, the material of two different compositions should be used in a passing direction of the tray 12.

According to the arrangement of the present embodiment, the maintenance required for exchanging the chip due to the determination in the present embodiment can be reduced, thereby providing an excellent manufacturing method.

The second method of manufacturing the magneto-optical recording medium in accordance with the present invention using a substrate opposed-type sputtering device.

The substrate opposed-type sputtering device is arranged such that a substrate is mounted to the substrate holder, and a target is place so as to face the substrate.

An example of the substrate opposed-type sputtering device will be explained below in reference to FIG. 9(a) and FIG. 9(b) which show schematic configuration of the device.

Figure 9:
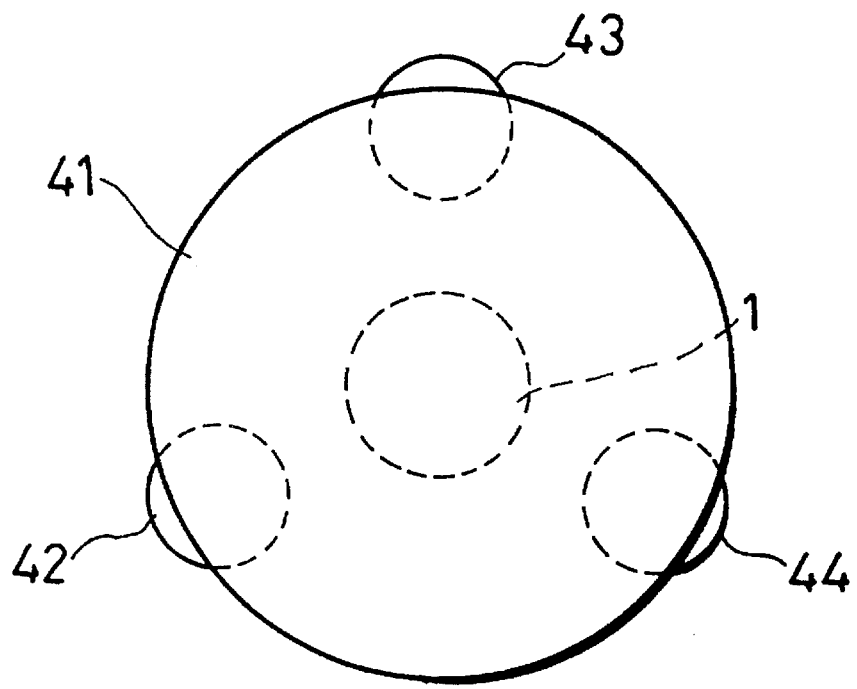
Figure 9:
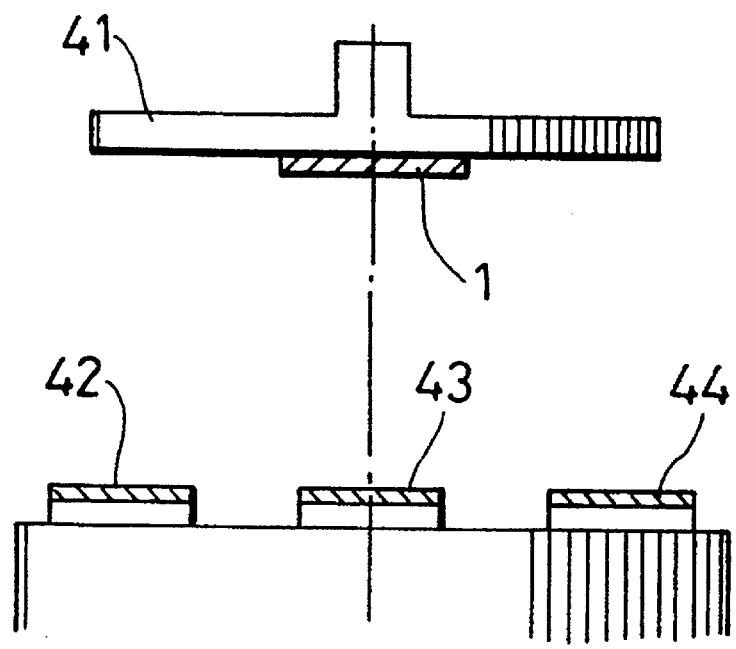

FIG. 9(a) is a plan view taken from above the substrate opposed type sputtering device, and FIG. 9(b) is a cross-sectional view of the device.

For convenience, the explanations will be given through the case where the light transmitting substrate 1 is mounted at the center of a disk holder 41. During sputtering operation, the disk holder 41 is either in its stoppage position or rotated.

In forming the GdFeCo readout layer 3 of the magneto-optical recording medium in accordance with the present invention, three targets of Gd, Fe and Co targets 42, 43 and 44 are used. In forming other layer, i.e., the transparent dielectric layers 2 and 5, and the recording layer 4, a Dy target and an Al target are used, however, these targets are not shown in figures. In forming the readout layer 3, the above-mentioned three targets 42, 43 and 44 are sputtered simultaneously so as to form a GdFeCo film by sputtering. The above-mentioned sputtering methods is called the Co-Sputtering method. In this Co-Sputtering method, the composition of the layer can be changed by altering a supplied power to each target.

The readout layer 3 of the present invention in which the Co composition varies in a direction perpendicular to the film surface can be manufactured by controlling the supplied power in the following manner. Here, on the light transmitting substrate 1, the transparent dielectric layer 2 is already formed by a reacting sputtering method in which an Al target (not shown) is sputtered in an atmosphere of nitrogen gas.

In the initial stage of forming the readout layer 3, i.e., when forming the side of the light transmitting substrate 1, the supplied power to the Co single target 44 is set relatively large, and the supplied power to the Fe single target 43 is set relatively small. Thereafter, the supplied power to the Co single target 44 is gradually made smaller, and the supplied power to the Fe single target 43 is gradually made larger. Here, the supplied power to the Gd single target 42 is maintained constant. Also, the respective supplied power to targets 42–44 are also maintained substantially constant.

According to the described method, the GdFeCo readout layer 3, in which the Co density on the side of light transmitting substrate 1 can be set high, and the Co density on the interface between itself and the recording layer 4 can be set low, can be achieved.

The third method of manufacturing the magneto-optical recording medium in accordance with the present invention using the rotatable sputtering device will be explained below in reference to FIGS. 10, 11(a) and 11(b).

Figure 10:
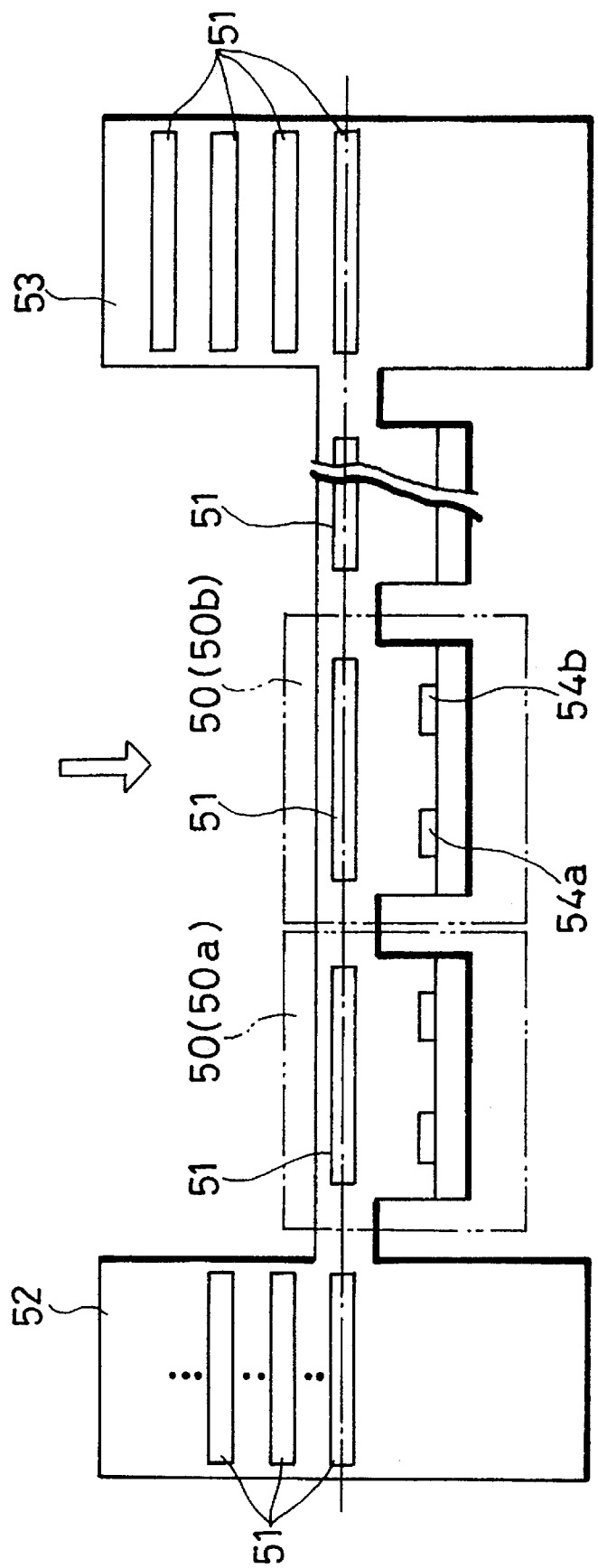
FIG. 10 is an explanatory view showing another manufacturing method of the magneto-optical recording medium of the present invention, which schematically shows the entire configuration of the rotatable sputtering device for use in the manufacturing method.

FIG. 10 is a view showing an entire configuration of the rotatable sputtering device suitable for mass-production, taken from above the device. FIG. 11(a) is a view showing a schematic configuration of the sputtering chamber 50b for use in forming the readout layer taken in a direction of an arrow in FIG. 10. FIG. 11(b) is a cross sectional view showing the target electrode in the sputtering chamber.

In the rotatable sputtering device, a plurality of light transmitting substrates 1 are mounted on a holder called pallet 51. The sputtering device is mainly composed of a loading chamber 52, a sputtering chamber 50 and an unloading chamber 53. In the loading chamber 52, a plurality of pallets 51 are placed, whereon the light transmitting substrates 1 are mounted, and this pallets 51 are transported to the sputtering chamber 50 in correct order by a transportation mechanism. Here, generally a single layer is formed in each sputtering chamber 50. Namely, in order to form the magneto-optical recording medium having the arrangement of the present invention, i.e., including the transparent dielectric layer 2, the readout layer 3, the recording layer 4 and the protective layer 5, four sputtering chambers are required including the first sputtering chamber for forming the transparent dielectric layer 2, the second sputtering chamber for forming the readout layer . . .

Figure 11:
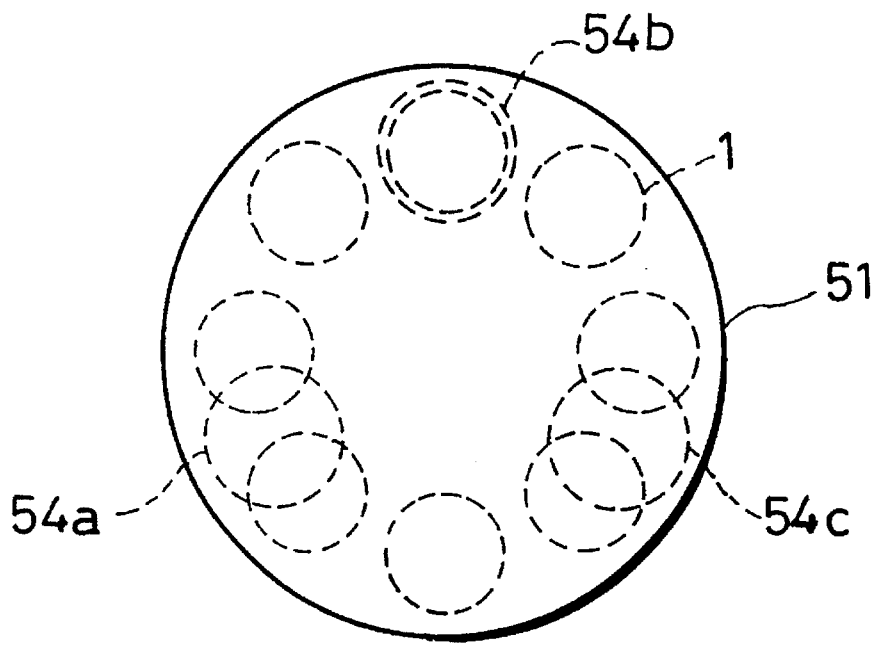
Figure 11:
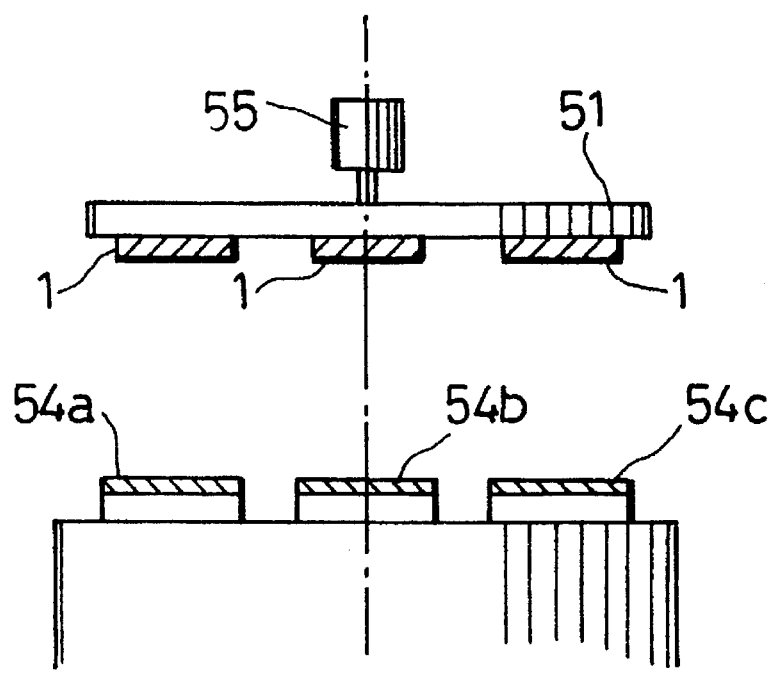

When the pallet 51 is transported to the predetermined position (usually the center) of the first sputtering chamber 50a from the loading chamber 52 (the transportation of the pallet 51 is temporarily held in this position), a sputtering film is formed by a single target 54 or a plurality of targets 54 placed so as to face in the sputtering chamber 50 while being rotated by the rotatable motor 55 shown in FIG. 11(b). During the film forming process, the light transmitting substrate 1 is also rotating (rotation) separately from the rotation (revolution) of the pallet 51.

When the first layer (transparent dielectric layer 2) has been formed, the pallet 51 is transported to the sputtering chamber 50b in order to form the readout layer 3. In the meantime, the next pallet 51 is transported to the sputtering chamber 50a for forming the first layer from the loading chamber 52. When all the films have been formed in the described manner, the pallet 51 is transported to the unloading chamber 53 and is stored therein. Then, the substrate 1 is taken out of the pallet 51 by setting back the pressure to the air pressure, thereby completing the film forming process.

The manufacturing method of the present invention using the described rotatable sputtering device will be explained below. First, the manufacturing process by the Co-sputtering method in which three single targets are used will be explained as in the case of the second embodiment.

In order to form the GdFeCo readout layer 3 in the magneto-optical recording medium in accordance with the present invention, a Gd target 54a, an Fe target 54b and a Co target 54c are set in the sputtering chamber 50b for forming the readout layer 3. When forming the readout layer 3, the above-mentioned three targets are discharged simultaneously so as for form a GdFeCo film by sputtering. According to the described Co-Sputtering method, the composition of the film can be changed by altering a supplied power power to each target.

The readout layer 3 of the present invention in which the Co composition varies in a direction perpendicular to the surface of the layer can be manufactured by controlling the supplied power in the following manner.

In the initial stage of forming the readout layer 3, i.e., when forming the side of the light transmitting substrate 1, the supplied power to the Co single target 54c is set relatively large, and the supplied power to the Fe single target 54b is set relatively small. Thereafter, the supplied power to the Co single target 54c is gradually made smaller, and the supplied power to the Fe single target 54b is gradually made larger. Here, the supplied power to the Gd single target 54a is maintained constant so that the total supply of the supplied power to each of the targets 54a, 54b and 54c is substantially constant.

According to the described method, the GdFeCo readout layer in which the Co density on the side of light transmitting substrate 2 can be set high, and the Co density on the interface between itself and the recording layer 4 can be set low can be achieved.

According to the described manufacturing method using the rotatable sputtering device, a sputtering chamber for altering the composition of the readout layer 3 in a direction perpendicular to the film surface is not required, and thus the method is excellent in terms of through put (processing ability), cost, and required installation space.

Figure 12:
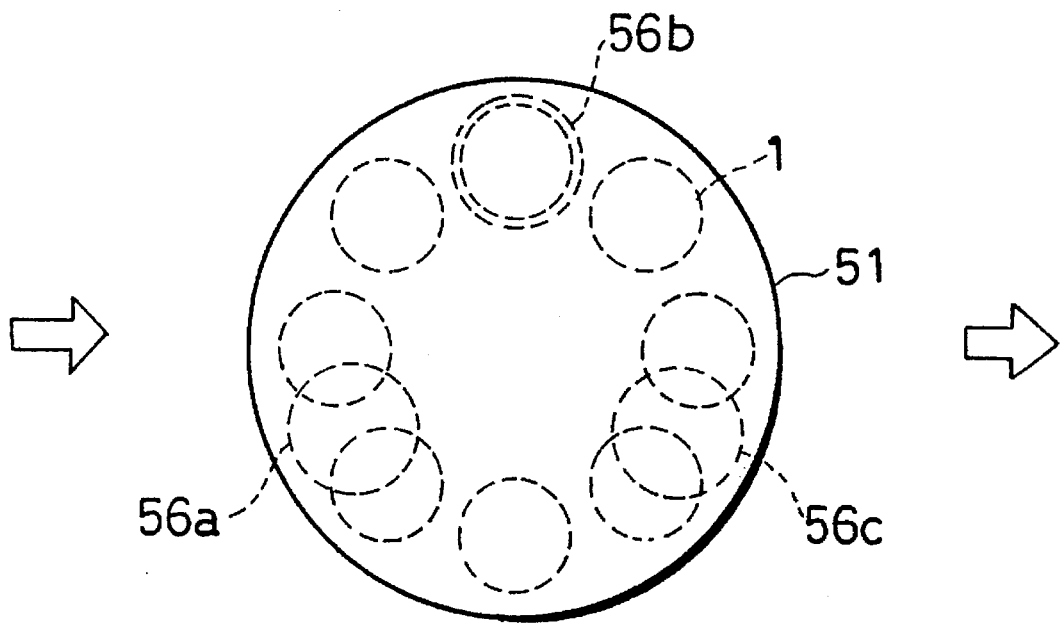
Figure 12:
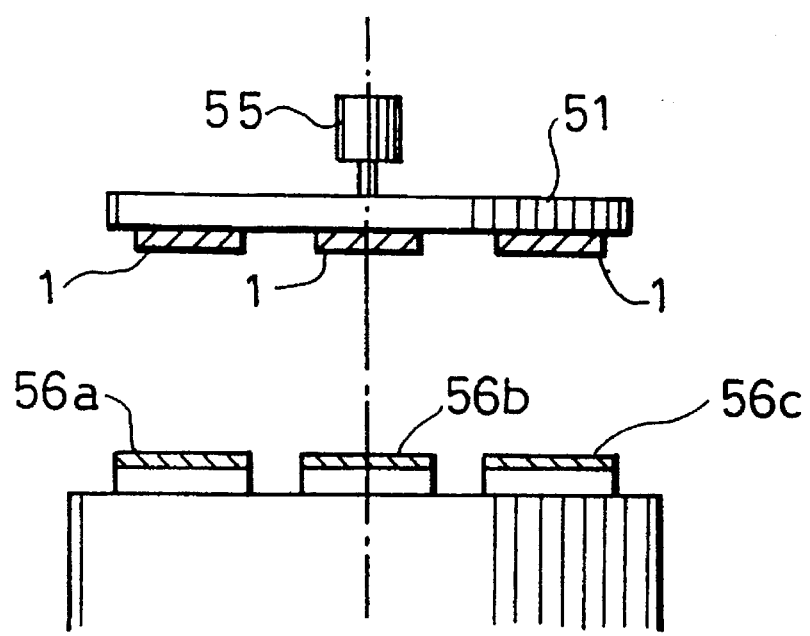

Next, another manufacturing method in accordance with the present invention will be explained in reference to FIG. 12(a) and FIG. 12(b). Like the FIG. 11(a) and FIG. 11(b), the FIG. 12(a) and FIG. 12(b) are views showing schematic configurations of the sputtering chamber for forming the readout layer in the rotatable sputtering device.

The manufacturing method is characterized in that in replace of the targets 54a, 54b and 54c of Gd, Fe and Co single targets shown in FIG. 11(a) and FIG. 11(b), a plurality of GdFeCo alloy targets are used.

In the present invention, GdFeCo alloy targets 56a, 56b and 56c having different compositions are used. Here, the GdFeCo alloy target 56a has the highest Co density, the GdFeCo alloy target 56b has an intermediate Co density, and the GdFeCo alloy target 56c has the lowest Co density.

In the manufacturing method using the described targets, first only the target 56a that has the highest Co density is discharged, and before the target 56a has been sputtered, instantaneously or after a certain transition period, it is switched to discharge the target 56b that has the intermediate Co density, thereby forming the layer by the target 56b. Thereafter, it is switched to discharge the target 56c that has the lowest Co density so as to from a layer by the target 56c, thereby forming the readout layer 3.

Needless to say, the greater number of alloy targets gives a better controlling ability of the Co density in the direction perpendicular to the film surface. However, it the number of electrodes becomes too large, the high cost would be required. From the results of the experiments for the recording medium of the present invention suggests that the particular effects of the present invention can be achieved by making the composition of the readout layer in the direction perpendicular to the film surface between the light incident side and the interface between the readout layer and the recording layer. Considering the above, the alloy targets of 2 or 3 should be sufficient.

According to the manufacturing method of the present invention, since the alloy target is used, the recording medium which has an excellent reproducibility can be achieved.

The manufacturing method of the present invention is not limited to be applied to the manufacturing method of the magneto-optical recording medium of the present invention. The method is also applicable to the magneto-optical recording medium having a single magnetic layer. Regarding the optical memory for use in forming thin films using the sputtering device, if it is required to change the composition in the direction perpendicular to the film surface, the manufacturing method of the present invention is applicable irrespectively of the lamination structure.

The applicability of the present invention to each of the described recording medium will be explained below.

In many of the magneto-optical recording medium having a plurality of magnetic layers that are laminated including the magneto-optical recording medium of the present invention, a material having high Curie temperature like GdFeCo is used on the side of the light transmitting substrate 1. (see for example, "Summary of the Meeting by the Japan Applied Magnetic Society, vol. 15, No. 5, 1991, pp. 838–844", hereinafter referred to as document 1, "Proceedings of Magneto-Optical Recording International Symposium' 92, J. Mgn. Soc. Jpn., Vol. 17, Supplement No. S1, 1993, pp. 205–208", hereinafter referred to as document 2, and "ISOM/ODS" '93 conference Digest, July, 1993, Postdeadline papers PD2", hereinafter referred to as a document 3, and "Summary of the 16th meeting by J. Magn. Soc. Japn., 1992, p. 438", hereinafter referred to as a document 4.

This is because the material having a high Curie temperature gives a large polar Kerr rotation angle θk in reproducing, thereby achieving a high reproducing signal quality.

In the magneto-optical recording medium disclosed in the documents 1–4, the magnetic interaction is exerted between the readout layer and the magnetic layer in contact therewith (corresponding to the recording layer in the present invention and to the switching layer, etc., in the documents), and utilizing the magnetic interaction, desirable magnetic properties of each layer can be achieved. It is clear that the magneto-optical recording medium and the manufacturing method of the present invention can be effectively applied to the recording medium disclosed in the documents 1–4 for the aforementioned reasons. Namely, in the readout layer, by changing the composition on the light incident side so as to have high Curie temperature without changing the composition on the interface between itself and the other magnetic layers, the polar Kerr rotation angle θk in reproducing can be made larger without greatly changing the magnetic interaction, thereby achieving an improvement in reproducing signal quality.

The following description shows a concrete example of the recording medium to which the present invention can be applied in reference to FIGS. 13–19.

For convenience in explanations, names of the magnetic layers and the main functions thereof are summarized in Table 2. In Table 2, the reference numerals for the respective layers in FIGS. 13–19 are shown in the brackets.

TABLE 2

| readout layer (60R) | magnetic layer for obtaining reproduced information |
| recording layer (60W) | magnetic layer for storing recorded information |
| subsidiary recording layer (60Ws) | magnetic layer that serves as an auxiliary layer for recording information on the recording layer (enabling an overwriting by the light intensity modulation) |
| initializing layer (60I) | magnetic layer for initializing a magnetizatin in the subsidiary recording layer in one direction (enabling an overwriting by the light intensity modulation) |
| switching layer (60S) intermediate layer (60Im) | magnetic layer for controlling magnetic interaction between magnetic layers |

Both of the subsidiary recording layer and the initializing layer are the magnetic layers which enable an overwriting by the light intensity modulation, and the properties of the respective magnetic layers are as presented below.

First, the subsidiary recording layer has a smaller coercive force than the recording layer at room temperature, and higher Curie temperature than the recording layer. A typical configuration having the recording subsidiary layer of the overwriting film for the light intensity modulation is:

recording layer/subsidiary recording layer.

Since the subsidiary recording layer is provided, using the initializing external magnetic field and the external recording magnetic field and recording laser beam of two levels (High power and Low power) in recording information, an overwriting by the light intensity modulation is enabled.

The initializing layer is a magnetic layer for eliminating the initializing external magnetic field. A configuration of the overwriting film by the light intensity modulation having the initializing layer is:

recording layer/subsidiary recording layer/switching layer/initializing layer. The initializing layer has a coercive force large enough to prevent an inversion of the magnetization even when recording (at high temperature) under an applied external recording magnetic field.

Both of the switching layer and the intermediate layer are the magnetic layers for controlling the magnetic interaction between magnetic layers, and the respective properties thereof are as presented below.

The switching layer has its Curie temperature at around 100° C., and is provided with a function for controlling the copying of the magnetization information from the recording layer to the readout layer. Namely, by projecting a reproducing light beam, in the portion on the medium, having a temperature rise above the Curie temperature of the switching layer, no effect receives from the magnetization in the switching layer, and thus the magnetic coupling between the readout layer and the recording layer no longer exists, thereby arranging the magnetization in the readout layer in one direction under an externally applied reproducing magnetic field. On the other hand, in the portion of the medium, having temperature below the Curie temperature of the switching layer, the magnetization information on the recording layer is copied to the readout layer via the switching layer. As the reproducing light beam is shifted relative to the recording medium, both the portion having a temperature above the Curie temperature of the switching layer and the portion having a temperature below the Curie temperature of the switching layer exist within a spot of the reproducing light beam, thereby enabling a reproducing of super resolution by making only the portion of low temperature subject to reproduction.

The intermediate layer is provided between the magnetic layers, and is provided for controlling the magnetic coupling between the two magnetic layers to the strength desired for each of the objectives: to lower the respective intensities of the external initializing magnetic field and the external recording magnetic field to be applied when overwriting by the light intensity modulation.

Figure 13:
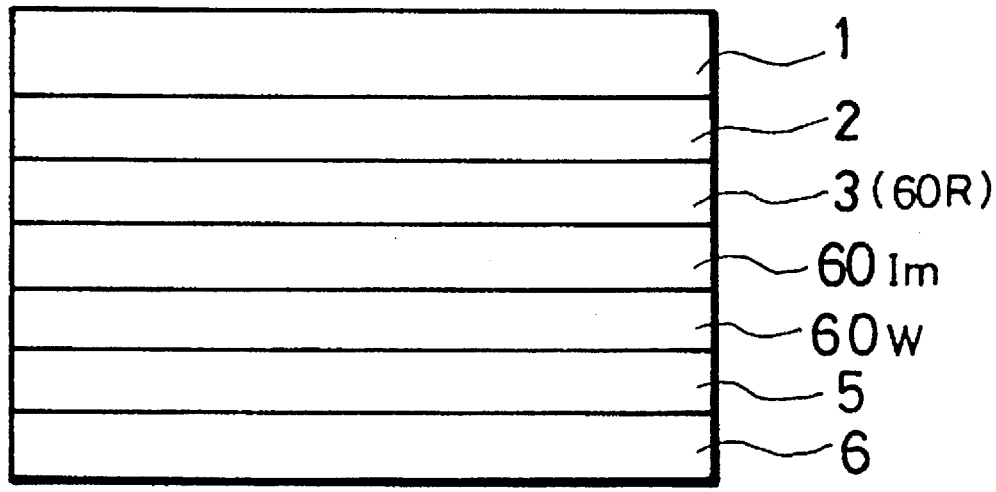
FIG. 13 is an explanatory view showing a schematic configuration of the magneto-optical recording medium in accordance with the present invention.

The medium having the arrangement of a three magnetic layered structure, shown in FIG. 13 is composed of the light transmitting substrate 1, whereon the transparent dielectric layer 2, the readout layer 3 (60R), the intermediate layer 60Im, the recording layer 60W, the protective layer 5 and the overcoat layer 6 are laminated in this order.

Figure 14:
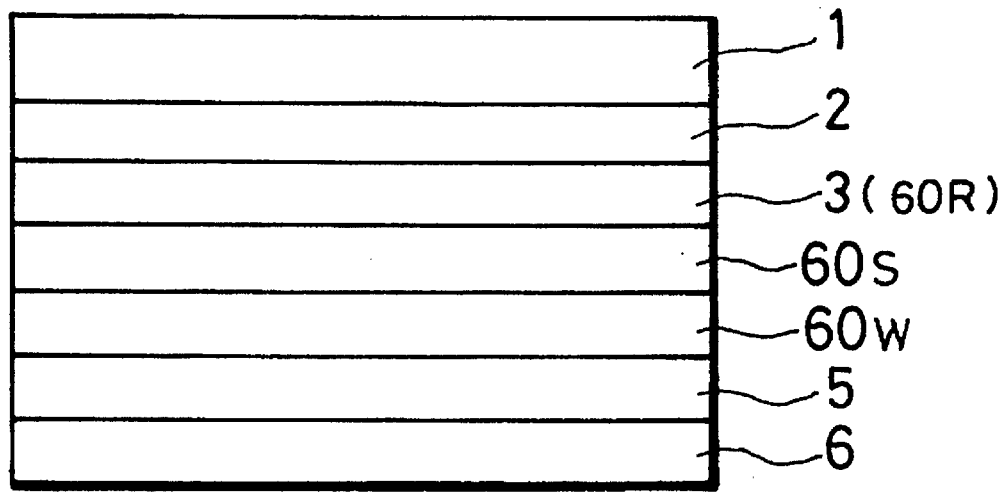
FIG. 14 is an explanatory view showing a schematic configuration of still another magneto-optical recording medium in accordance with the present invention.

The medium having the arrangement of a three magnetic layered structure, shown in FIG. 14 is composed of the light transmitting substrate 1, whereon the transparent dielectric layer 2, the readout layer 3 (60R), the switching layer 60S, the recording layer 60W, the protective layer 5 and the overcoat layer 6 are laminated in this order.

Figure 15:
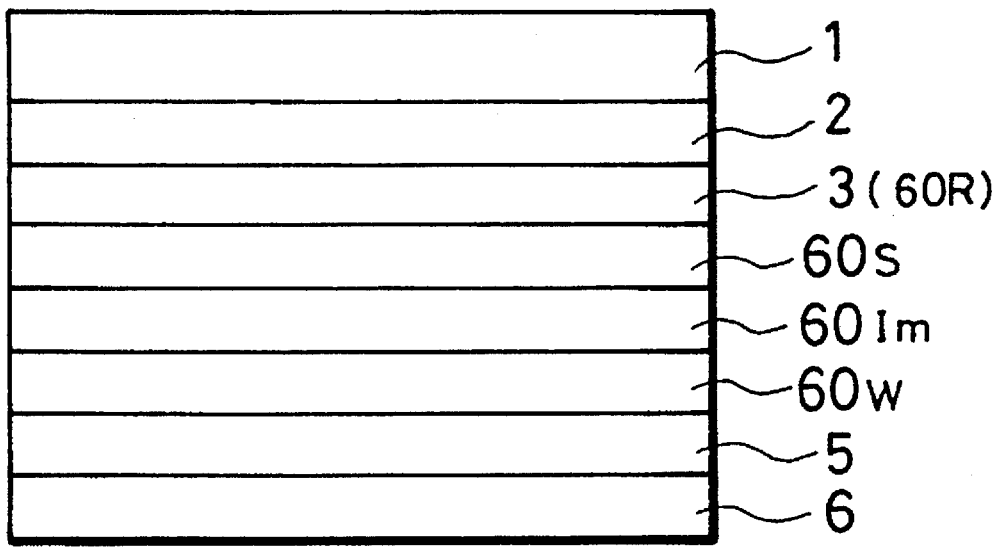
FIG. 15 is an explanatory view showing a schematic configuration of still another magneto-optical recording medium in accordance with the present invention.

The medium having the arrangement of a four magnetic layered structure, shown in FIG. 15 is composed of the light transmitting substrate 1, whereon the transparent dielectric layer 2, the readout layer 3 (60R), the switching layer 60S, the intermediate layer 60Im, the recording layer 60W, the protective layer 5 and the overcoat layer 6 are laminated in this order.

Figure 16:
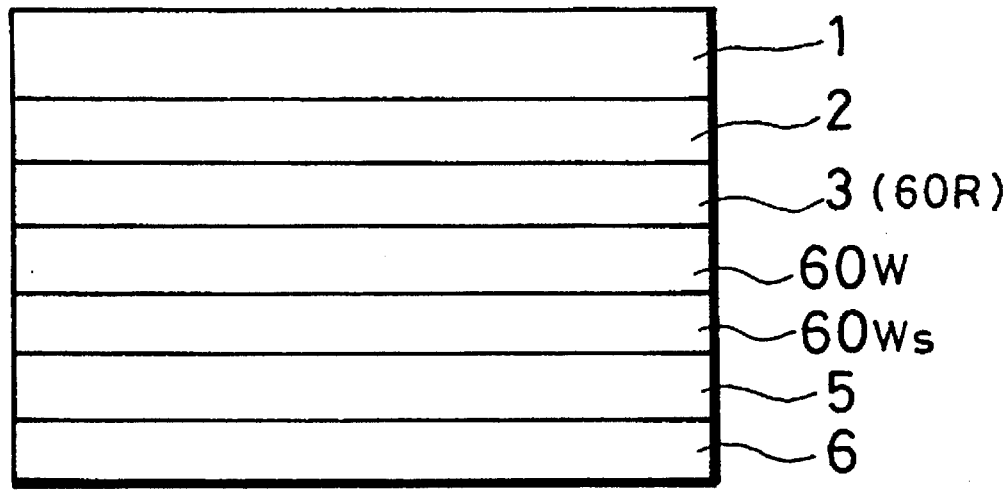
FIG. 16 is an explanatory view showing a schematic configuration of still another magneto-optical recording medium in accordance with the present invention.

The medium having the arrangement of a three magnetic layered structure, shown in FIG. 16 is composed of the light transmitting substrate 1, whereon the transparent dielectric layer 2, the readout layer 3 (60R), the recording layer 60W, the subsidiary recording layer 60Ws, the protective layer 5 and the overcoat layer 6 are laminated in this order.

Figure 17:
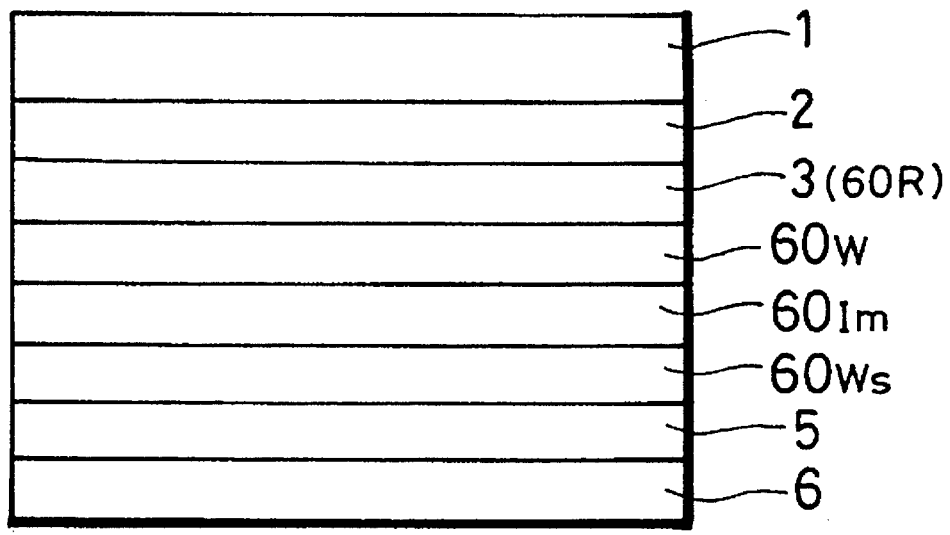
FIG. 17 is an explanatory view showing a schematic configuration of still another magneto-optical recording medium in accordance with the present invention.

The medium having the arrangement of a four magnetic layered structure, shown in FIG. 17 is composed of the light transmitting substrate 1, whereon the transparent dielectric layer 2, the readout layer 3 (60R), the recording layer 60W, the intermediate layer 60Im, the subsidiary recording layer 60Ws, the protective layer 5 and the overcoat layer 6 are laminated in this order.

Figure 18:
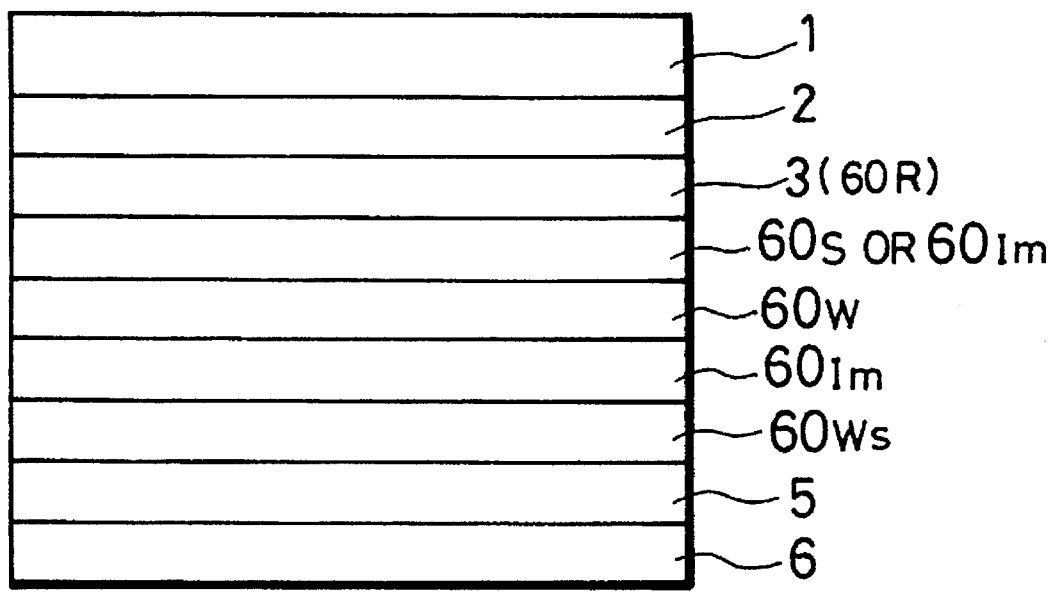
FIG. 18 is an explanatory view showing a schematic configuration of still another magneto-optical recording medium in accordance with the present invention.

The medium having the arrangement of a five magnetic layered structure, shown in FIG. 18 is composed of the light transmitting substrate 1, whereon the transparent dielectric layer 2, the readout layer 3 (60R), the recording layer 60W, the switching layer 60S or the intermediate layer 60Im, the recording layer 60W, the intermediate layer 60Im, the subsidiary recording layer 60Ws, the protective layer 5 and the overcoat layer 6 are laminated in this order.

Figure 19:
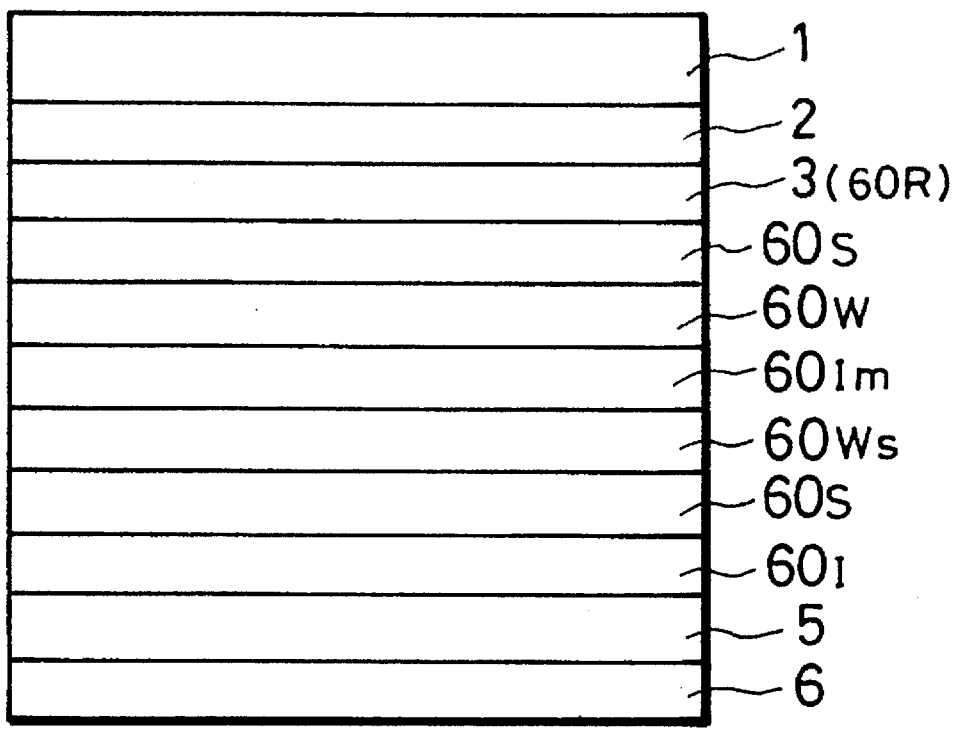
FIG. 19 is an explanatory view showing a schematic configuration of still another magneto-optical recording medium in accordance with the present invention.

The medium having the arrangement of a seven magnetic layered structure, shown in FIG. 19 is composed of the light transmitting substrate 1, whereon the transparent dielectric layer 2, the readout layer 3 (60R), the switching layer 60S, the recording layer 60W, the intermediate layer 60Im, the subsidiary recording layer 60Ws, the switching layer 60S, the initializing layer 60I, the protective layer 5 and the overcoat layer 6 are laminated in this order.

The respective arrangements of the recording medium shown in FIGS. 13–19 are summarized in Table 3.

TABLE 3

| No. | FIG. | Arrangement of Recording Medium |
| --- | --- | --- |
| 1 | FIG. 13 | substrate/GdFeCo readout layer/ intermediate layer/recording layer |
| 2 | FIG. 14 | substrate/GdFeCo readout layer/ switching layer/recording layer |
| 3 | FIG. 15 | substrate/GdFeCo readout layer/ switching layer/intermediate layer/ recording layer |
| 4 | FIG. 16 | substrate/GdFeCo readout layer/ recording layer/subsidiary recording layer |
| 5 | FIG. 17 | substrate/GdFeCo readout layer/ recording layer/intermediate layer/ subsidiary recording layer |
| 6 | FIG. 18 | substrate/GdFeCo readout layer/ switching layer or intermediate layer/ recording layer/intermediate layer/ subsidiary recording layer |
| 7 | FIG. 19 | substrate/GdFeCo readout layer/ switching layer/recording layer/ intermediate layer/subsidiary recording layer/switching layer/initializing layer |

The features of the described arrangements and the effects that can be achieved from the arrangements will be explained below.

In the arrangements shown in FIGS. 13–15, the intermediate layer 60Im and/or the switching layer 60S are formed between the readout layer 3 and the recording layer 4 of the arrangement shown in FIG. 1 explained at the very beginning of the embodiment. According to the described arrangements, since the intensity of the external recording magnetic field required for recording information can be made smaller, an overwriting by the magnetic field modulation is enabled, or the reproducing operation by high resolution can be stabilized or performed desirably.

In addition to the effect that a reproducing operation by high resolution achieved from the described arrangements, the arrangements shown in FIGS. 16–19 enable an overwriting operation by the light intensity modulation.

From any of the described arrangements, by applying the feature of the present invention that only the Co density on the light incident side is raised without changing the composition of the interface between the readout layer and one of other magnetic layers constant, the reduction in the required intensity of the external magnetic field, the stabilization in the reproduction of high resolution, and the overwriting function by the light intensity modulation can be ensured, and an improved reproducing signal quality can be achieved.

The arrangement of the medium wherein a reproducing light is incident from the opposite side of the substrate will be explained below.

Figure 20:
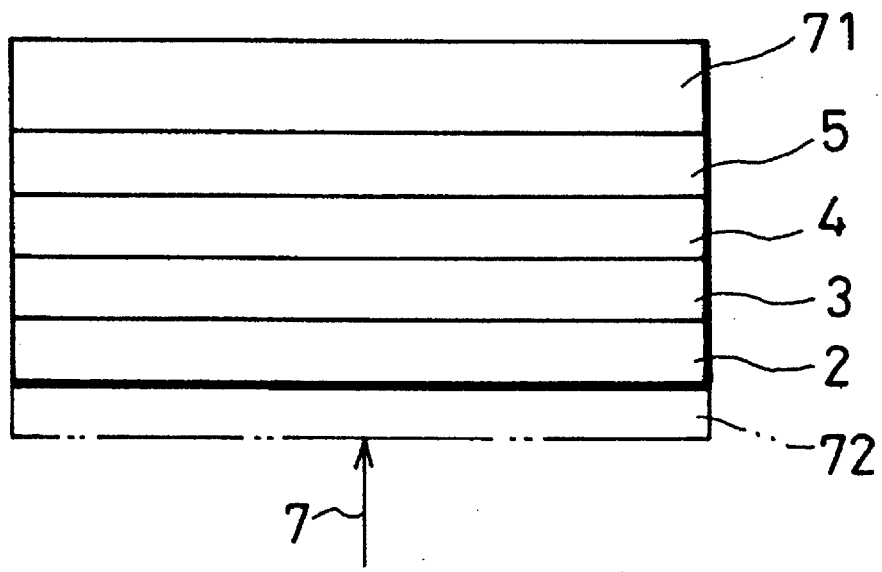
FIG. 20 is an explanatory view showing a schematic configuration of still another magneto-optical recording medium in accordance with the present invention.

In the arrangement of the present embodiment, the explanations have been given through the case where there reproducing laser light 7 is projected from the side of the light transmitting substrate 1 in the arrangement of the medium (shown in FIG. 1, and FIGS. 13–19). For comparison, like the medium having the arrangement shown in FIG. 20, in the case where a substrate 71 that is not light transmitting is employed, it would be arranged such that the transparent dielectric layer 2, the readout layer 3, the recording layer 4, the protective layer 5 and the substrate 71 are laminated in this order from the light incident side. According to this comparative arrangement, the Curie temperature on the light incident side of the readout layer 3 is set to high temperature, and the Curie temperature on the side of the recording layer 4 is set to low temperature, as is clear from the main objective of the present invention.

The same can be set when the substrate that is not light transmitting is used in other arrangements of FIG. 13–FIG. 19. In this case, in order to protect the transparent dielectric layer 2, it is preferable that a protective resin layer 72 (with a thickness of several μm–several hundreds μm) that shows an excellent light transmitting property is formed on the light incident side as shown in the alternate long and two short dashes line in FIG. 20.

Next, the magneto-optical recording medium having layers that are laminated will be explained below.

The arrangements of the recording medium explained with reference to FIG. 1, and FIGS. 13–19 are called a single-sided type, and on the protective layer 5, an ultraviolet ray is projected so as to form an ultraviolet ray hardening type resin so as to form the overcoat layer 6 made of high polymer resin.

Figure 21:
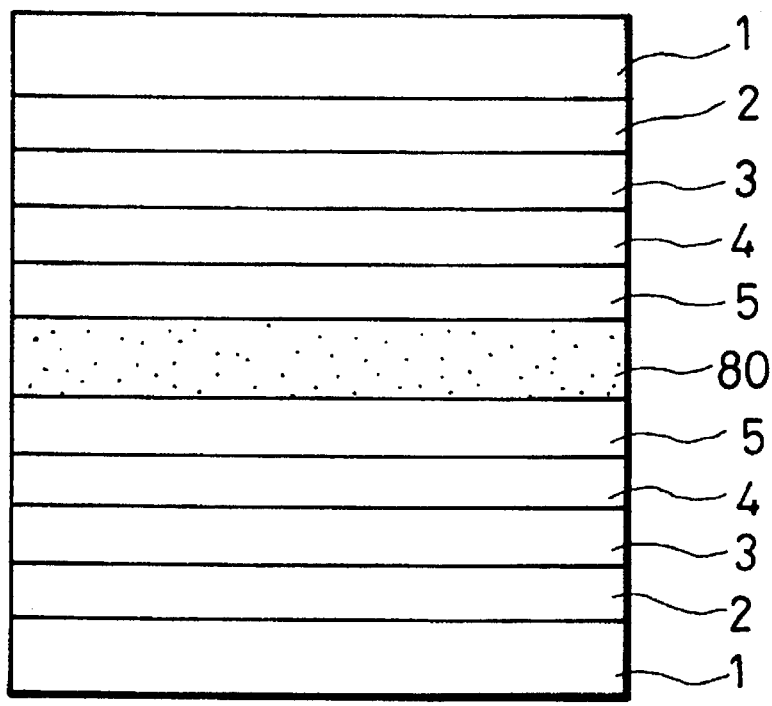
FIG. 21 is an explanatory view showing a schematic configuration of still another magneto-optical recording medium in accordance with the present invention, wherein layers are laminated.
Figure 22:
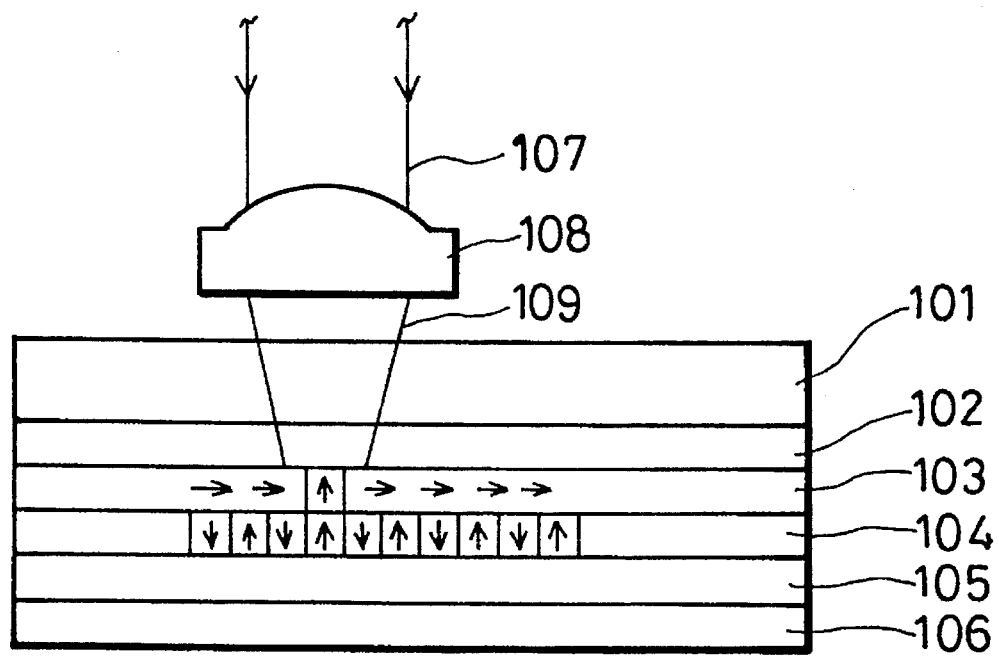
FIG. 22 is an explanatory view showing a schematic configuration of a conventional magneto-optical disk.
Figure 23:
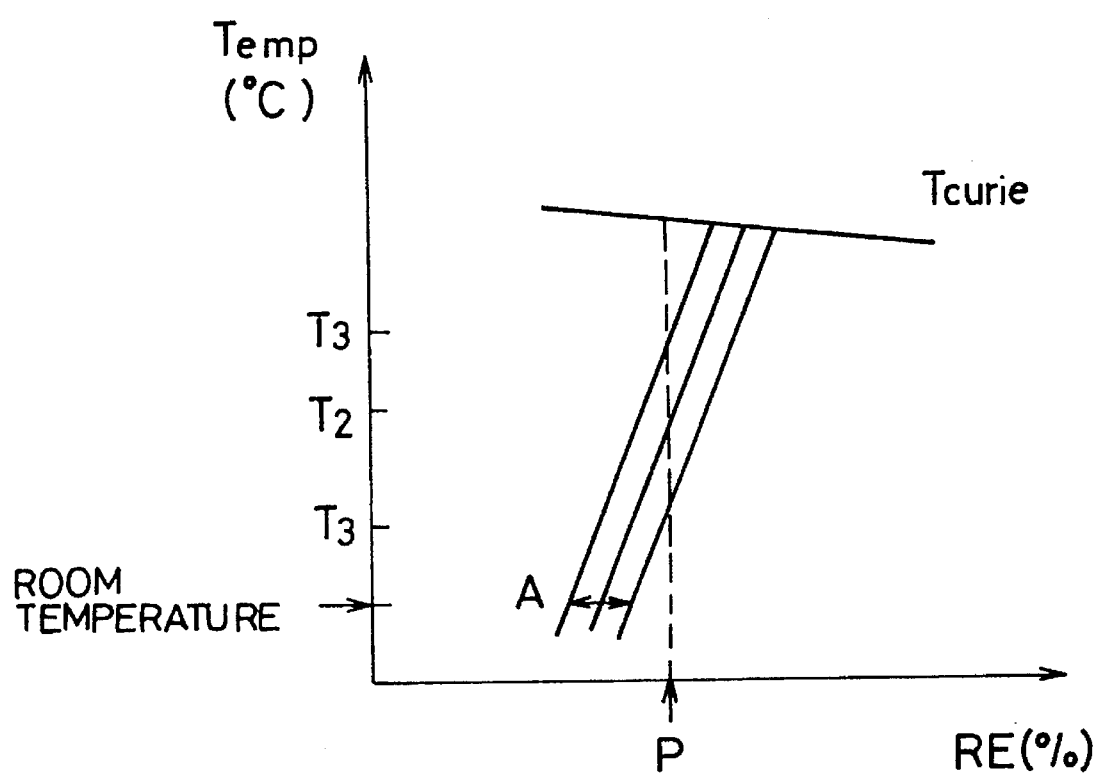
FIG. 23 is a magnetic phase diagram showing a magnetic properties of the readout layer in the magneto-optical disk of FIG. 22.
Figure 24A:
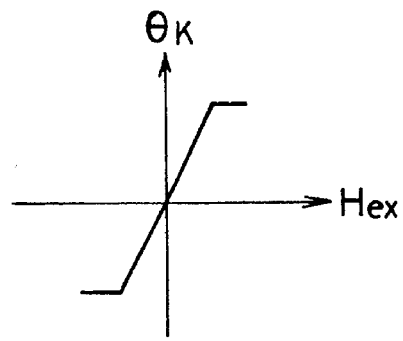
FIG. 24(a) through FIG. 24(d) are explanatory view showing the relationship between the externally applied magnetic field to be applied to the readout layer of the magneto-optical disk of FIG. 22 and the polar Kerr rotation angle.
Figure 24B:
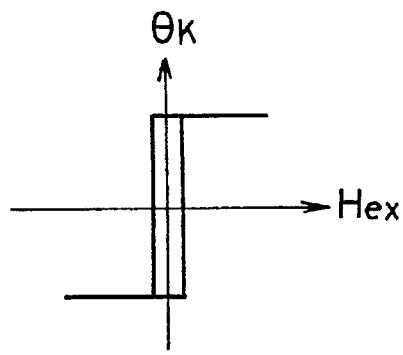
Figure 24C:
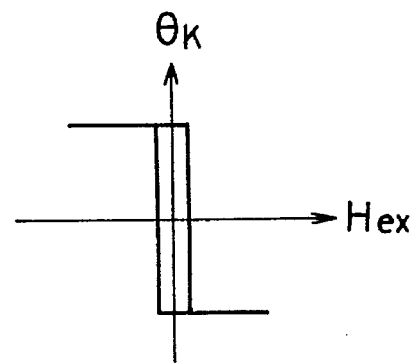
Figure 24D:
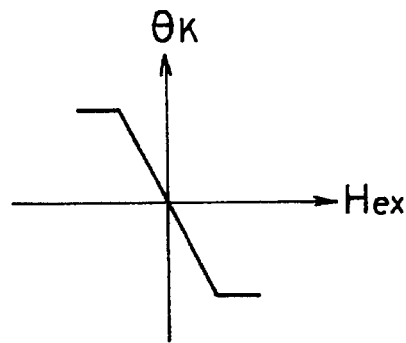
Figure 25:
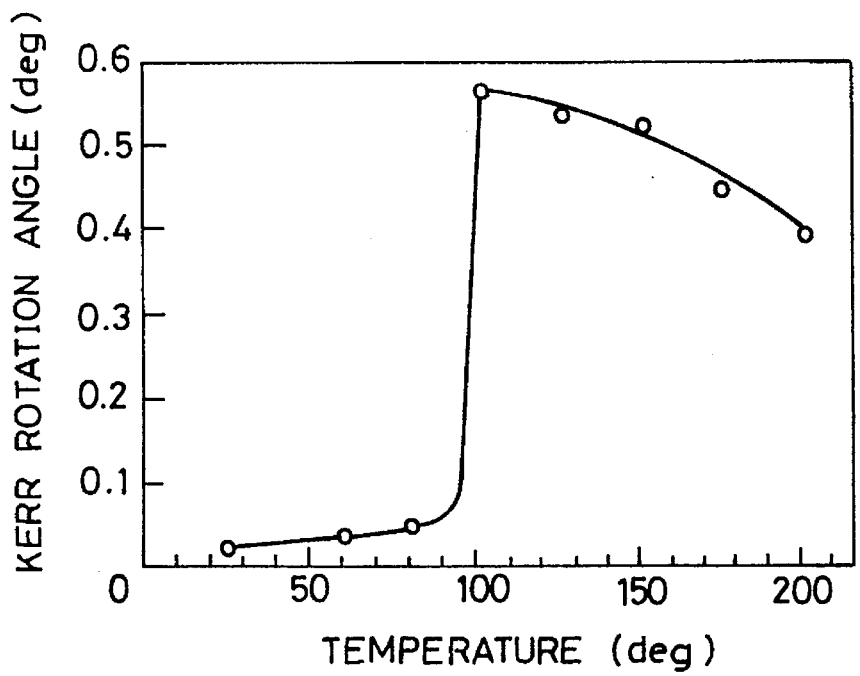
FIG. 25 is a graph showing one example of the temperature dependency of the polar Kerr rotation angle of the readout layer in the magneto-optical disk of FIG. 22.
Figure 26:
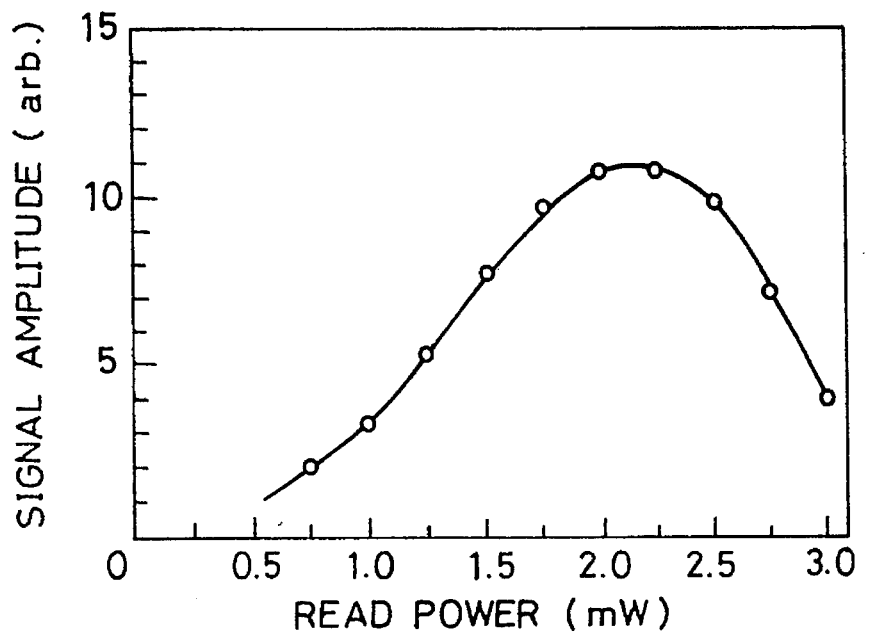
FIG. 26 is a graph showing the relationship between the reproducing laser power and the amplitude of the reproducing signal in the magneto-optical disk having properties shown in FIG. 25.

There is another type of the recording medium called both-sided type, wherein two substrates are laminated with the recording medium thin film inside. An example of the magneto-optical recording medium of this type using the recording medium of FIG. 1 is shown in FIG. 21. In this arrangement, the recording medium thin films 2–5 formed on the two light transmitting substrate 1 are laminated by an adhesive material 80. For a preferable adhesive material 80, an anaerobic-thermosetting ultraviolet hardening adhesive material, for example, made of polyurethane acrylate series may be used. Here, the surface structure is not limited to the described structure. For example, in the state shown in FIG. 1, the overcoat layers 6 may be laminated by an adhesive material 70. In this case, for the adhesive material 80, the both-side adhesive tape may be used other than the described adhesive material.

For the material for the readout layer, only the GdFeCo is used in the present embodiment. However, the present invention is not limited to this, other materials such as TbFeCo, DyFeCo, HoFeCo, etc., including Co may be used as well.

As described, the magneto-optical recording medium in accordance with the present invention having a plurality of magnetic layers including at least two magneto-optical layers of a readout layer for reading out information, and a recording layer for recording thereon information, for recording thereon and reproducing therefrom information using a magnetic interaction between magnetic layers, wherein the readout layer has a varying composition in a direction perpendicular to a the surface thereof, in such a manner that Curie temperature on a reproducing light incident side is higher than Curie temperature on a recording layer side.

According to the described arrangement, by setting only the Curie temperature on the reproducing light incident side of the readout layer high, the polar Kerr rotation angle in reproducing can be increased, thereby improving a reproducing signal quality. Moreover, the Curie temperature on the recording layer side of the readout layer remains unchanged, changes in the magnetic interaction between the readout layer and the recording layer or other magnetic layer provided between the readout layer and the recording layer can be reduced.

The magneto-optical recording medium in accordance with the present invention having the described arrangement may be arranged such that the readout layer is a magnetic layer which is in in-plane magnetization at room temperature, and in which a transition occurs from in-plane to perpendicular magnetization when temperature thereof is raised by projecting thereto a reproducing light. According to the described arrangement, since the threshold temperature at which a transition occurs from the in-plane magnetization to perpendicular magnetization maintains substantially constant, and the laser power required in reproduction will not change much, thereby obtaining a high quality reproducing signal.

Another magneto-optical recording medium in accordance with the present invention is arranged such that the readout layer is made of GdFeCo, and the Co density on the reproducing light incident side is set higher than that on the recording layer side. In this case, the Curie temperature of the readout layer can be set high without changing the Gd density by increasing the Co density. Therefore, the polar Kerr rotation angle in reproducing can be made larger without greatly changing the magnetic interaction between the readout layer and the recording layer or another magnetic layer provided between the readout layer and the recording layer also can be maintained substantially constant, thereby achieving improvements in signal quality.

The method for manufacturing the magneto-optical recording medium in accordance with the present invention is characterized in that when forming the recording medium thin film on the substrate using the substrate transmitting type sputtering device, a target on an electrode, having a composition that varies between where the substrate starts passing into the target and the substrate passes through the target is employed for the target for the readout layer.

According to the described manufacturing method, in the substrate transmitting type sputtering device, a layer having a varying composition in a direction perpendicular to the film surface can be desirably manufactured without increasing the number of electrodes. Namely, the described layer can be manufactured by a single electrode. Therefore, the described method is a desirable method for manufacturing the magneto-optical recording medium of the present invention without increasing the size of the sputtering device and the manufacturing cost.

Another method for manufacturing the magneto-optical recording medium in accordance with the present invention is characterized in that when forming a recording medium thin film using a rotatable sputtering device on the substrate, the Co-sputtering method wherein the plurality of single targets can be discharged simultaneously in the same sputtering chamber, and in that the sputtering power supplied to the target electrode varies in forming the readout layer.

According to another method for manufacturing the magneto-optical recording medium in accordance with the present invention using a rotatable sputtering device, when forming a recording medium thin film on the substrate, a plurality of alloy targets made of the same material but of different compositions are set in the same sputtering chamber, after completing the initial stage of forming the layer by discharging only the alloy target having the highest Curie temperature, by switching the target to be discharged from the target of higher Curie temperature to the target of lower Curie temperature, the readout layer is formed.

According to the described manufacturing method using the rotatable sputtering device, without increasing the number of sputtering chambers, a layer having a varying composition in a direction perpendicular to the surface of the layer can be formed in the same sputtering chamber, thereby preventing the problem that the sputtering device becomes larger in size and the manufacturing cost increases, thereby achieving a desirable method.

The invention being thus described, it will be obvious that the same way be varied in many ways. Such variations are not to be regarded as a departure from the spirit and scope of the invention, and all such modifications as would be obvious to one skilled in the art are intended to be included within the scope of the following claims.

What is claimed is:

1. A magneto-optical recording medium, comprising:
    a plurality of magnetic layers including at least two magneto-optical layers of a readout layer for reading out information and a recording layer for recording thereon information, for recording thereon and reproducing therefrom information using a magnetic interaction exerted between magnetic layers,
    wherein said readout layer has a varying composition in a direction perpendicular to a surface thereof, in such a manner that Curie temperature on a reproducing light incident side is higher than Curie temperature on a recording layer side.

2. The magneto-optical recording medium as set forth in claim 1, wherein:
    said readout layer is made of rare-earth transition metal alloy including Co, and a Co density on the reproducing light incident side is higher than a Co density on the recording layer side.

3. The magneto-optical recording medium as set forth in claim 2, wherein:
    said readout layer is made of GdFeCo.

4. The magneto-optical recording medium as set forth in claim 3, wherein:
    when the composition of said readout layer on the light incident side is Gdx (Fe$_{1-Y_f}$Co$_{Y_f}$)$_{1-x}$, the composition on the recording layer side is Gdx (Fe$_{1-Y_r}$Co$_{Y_r}$)$_{1-x}$, a Gd density X is X=0.25 ±0.05, a Co density Yi on the reproducing light incident side is in a range of 0.1<Yi<0.5, and a Co density Yr on the recording layer side is in a range of 0.1≦Yr<0.4.

5. The magneto-optical recording medium as set forth in claim 2, wherein:

said readout layer is made of TbFeCo.

6. The magneto-optical recording medium as set froth in claim 2, wherein:

said readout layer is made of DyFeCo.

7. The magneto-optical recording medium as set forth in claim 2, wherein:

said readout layer is made of HoFeCo.

8. The magneto-optical recording medium as set forth in claim 1, wherein:

the Curie temperature of said recording layer is above 200° C. so as to prevent information from being recorded when reproducing light is projected in reproducing information.

9. The magneto-optical recording medium as set forth in claim 1, wherein:

said recording layer is made of DyFeCo.

10. The magneto-optical recording medium as set forth in claim 8, wherein:

said recording layer is made of $Dy_{0.23}(Fe_{0.78}Co_{0.22})_{0.77}$ having a Curie temperature of 210° C.

11. The magneto-optical recording medium as set forth in claim 8, wherein:

an upper limit of the Curie temperature of said recording layer is substantially 300° C.

12. The magneto-optical recording medium as set forth in claim 1, wherein:

said readout layer has in-plane magnetization at room temperature, while a transition occurs therein from in-plane magnetization to perpendicular magnetization when temperature thereof is raised by projecting thereon reproducing light.

13. The magneto-optical recording medium as set forth in claim 12, wherein:

said readout layer is made of GdFeCo, and a Co density on the reproducing light incident side is higher than a Co density on the recording layer side.

14. The magneto-optical recording medium as set forth in claim 1, further comprising:

a light transmitting substrate, a transparent dielectric layer, a protective layer and an overcoat layer, wherein said transparent dielectric layer, the plurality of magnetic layers, the protective layer and the overcoat layer are laminated on said light transmitting substrate in this order.

15. The magneto-optical recording medium as set forth in claim 1, being both-sided type which further comprises two light transmitting substrates, wherein said plurality of magnetic layers are laminated on said substrate in such a manner that readout layers are symmetrically formed respectively closer to said substrates than recording layers.

16. A magneto-optical recording medium, comprising:

at least two magneto-optical layers of a readout layer for reading out information, and a recording layer for recording thereon information, for recording thereon and reproducing therefrom information using magnetic interaction between magnetic layers, wherein said readout layer has a varying composition in a direction perpendicular to a film surface in such a manner that Curie temperature on a reproducing light incident side is higher than Curie temperature on a side opposite to the reproducing light incident side.

* * * * *